United States Patent
Kubota

(10) Patent No.: US 9,632,549 B2
(45) Date of Patent: Apr. 25, 2017

(54) ELECTRONIC APPARATUS, METHOD OF CONTROLLING ELECTRONIC APPARATUS AND CONTROL DEVICE FOR CONTROLLING ELECTRONIC APPARATUS BASED ON CALCULATED FLOW RATE

(71) Applicant: FUJITSU LIMITED, Kawasaki-shi, Kanagawa (JP)

(72) Inventor: Jumpei Kubota, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 347 days.

(21) Appl. No.: 14/467,462

(22) Filed: Aug. 25, 2014

(65) Prior Publication Data

US 2015/0103485 A1    Apr. 16, 2015

(30) Foreign Application Priority Data

Oct. 16, 2013    (JP) ................. 2013-215863

(51) Int. Cl.
*G06F 1/20* (2006.01)
*H05K 7/20* (2006.01)

(52) U.S. Cl.
CPC ......... *G06F 1/206* (2013.01); *H05K 7/20281* (2013.01); *G06F 2200/201* (2013.01); *Y02B 60/1275* (2013.01)

(58) Field of Classification Search
None
See application file for complete search history.

(56) References Cited

U.S. PATENT DOCUMENTS

| 2012/0325013 A1* | 12/2012 | Rubenstein ............... G06F 1/20 73/861.08 |
| 2013/0248140 A1* | 9/2013 | Haigh ..................... G06F 1/206 165/11.1 |
| 2014/0020885 A1* | 1/2014 | Chainer ............. H05K 7/20836 165/287 |
| 2014/0146845 A1* | 5/2014 | Chainer ............... G01K 15/005 374/1 |

(Continued)

FOREIGN PATENT DOCUMENTS

JP    61-61893 U    4/1986
JP    63-015120      1/1988

*Primary Examiner* — Ryan Jarrett
(74) *Attorney, Agent, or Firm* — Staas & Halsey LLP

(57) ABSTRACT

An electronic apparatus includes: a flowpath through which a liquid flows; a heat-generating body that is cooled by the liquid; a liquid temperature measuring device that measures a temperature of the liquid; a temperature measuring device that measures a temperature of the heat-generating body; a heat generation amount measuring device that measures a heat generation amount of the heat-generating body; a storage apparatus that stores information representing a relationship between a temperature of the liquid, a temperature of the heat-generating body, a heat generation amount of the heat-generating body, and a flow rate of the liquid; and a processing apparatus that calculates the flow rate of liquid from the temperature of the liquid measured by the liquid temperature measuring device, the temperature of the heat-generating body measured by the temperature measuring device, and the heat generation amount of the heat-generating body based on information inside the storage apparatus.

18 Claims, 12 Drawing Sheets

(56) References Cited

U.S. PATENT DOCUMENTS

2014/0326010 A1* 11/2014 Kawakami ............. B60H 1/323
  62/222
2016/0066472 A1* 3/2016 Cader .................... G06F 1/206
  361/699

* cited by examiner

|  | $Q_1$ (20 W) | $Q_2$ (40 W) | $Q_3$ (80 W) |
|---|---|---|---|
| $T_{S1}$ (30°C) | $u_{11}$ (=0.16 l/min) | $u_{12}$ (=0.64 l/min) | $u_{13}$ (=2.56 l/min) |
| $T_{S2}$ (40°C) | $u_{21}$ (=0.04 l/min) | $u_{22}$ (=0.16 l/min) | $u_{23}$ (=0.64 l/min) |
| $T_{S3}$ (60°C) | $u_{31}$ (=0.01 l/min) | $u_{32}$ (=0.04 l/min) | $u_{33}$ (=0.16 l/min) |

ELECTRONIC APPARATUS, METHOD OF CONTROLLING ELECTRONIC APPARATUS AND CONTROL DEVICE FOR CONTROLLING ELECTRONIC APPARATUS BASED ON CALCULATED FLOW RATE

CROSS-REFERENCE TO RELATED APPLICATION

This application is based upon and claims the benefit of priority from the prior Japanese Patent Application No. 2013-215863 filed on Oct. 16, 2013, the entire contents of which are incorporated herein by reference.

FIELD

The embodiments discussed herein are related to an electronic apparatus, a method of controlling an electronic apparatus, and a program for controlling an electronic apparatus.

BACKGROUND

In the related art, an electronic appliance is known that is formed of a plurality of electronic modules that contain electronic components and in which the electronic modules are cooled by forced circulation of a coolant maintained at a certain temperature and flow rate by a temperature adjusting mechanism and a flow rate adjusting mechanism (for example refer to Japanese Unexamined Utility Model Registration Application Publication No. 61-61893).

In such an electronic appliance, a flowmeter is provided on the side from which a coolant is supplied to the electronic modules.

However, with the configuration described in Japanese Unexamined Utility Model Registration Application Publication No. 61-61893, since the flowmeter is located in the circulation path of the coolant, there is a possibility that pressure loss will be increased in the flowpath and that the flowmeter will breakdown due to clogging.

SUMMARY

According to an aspect of the invention, an electronic apparatus includes: a flowpath through which a liquid flows; a heat-generating body that is cooled by the liquid; a liquid temperature measuring device that measures a temperature of the liquid; a temperature measuring device that measures a temperature of the heat-generating body; a heat generation amount measuring device that measures a heat generation amount of the heat-generating body; a storage apparatus that stores information representing a relationship between a temperature of the liquid, a temperature of the heat-generating body, a heat generation amount of the heat-generating body, and a flow rate of the liquid; and a processing apparatus that calculates the flow rate of liquid from the temperature of the liquid measured by the liquid temperature measuring device, the temperature of the heat-generating body measured by the temperature measuring device, and the heat generation amount of the heat-generating body based on information inside the storage apparatus.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereafter, embodiments will be described in detail while referring to the appended drawings.

Figure 1:
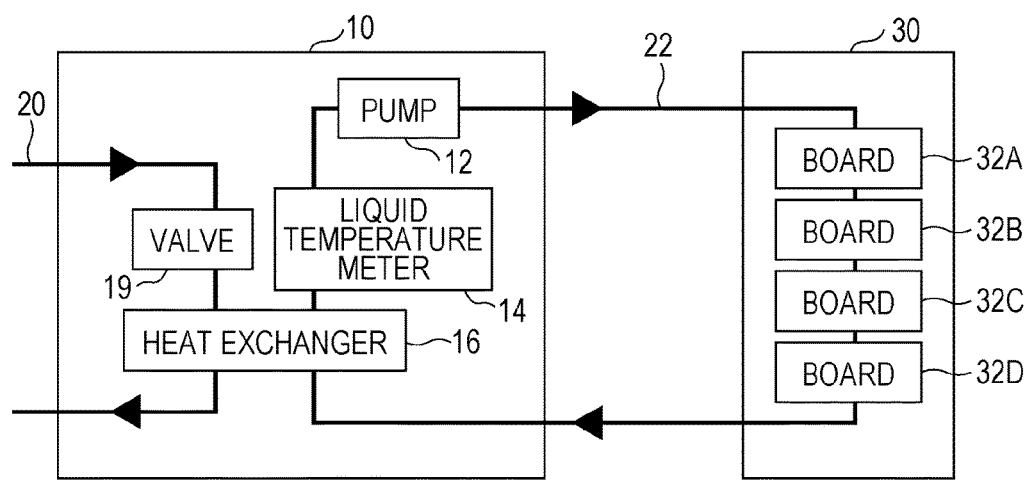
FIG. 1 schematically illustrates the entire structure of an electronic apparatus according to an embodiment.

FIG. 1 schematically illustrates the entire structure of an electronic apparatus 1 according to an embodiment. The electronic apparatus 1 includes a coolant circulation device 10 and a computer 30.

The coolant circulation device 10 includes a heat-radiating flowpath 20 and a cooling flowpath 22. In addition, a heat exchanger 16 is provided between the heat-radiating flowpath 20 and the cooling flowpath 22. The heat exchanger 16 causes heat to be transferred from a liquid inside the cooling flowpath 22 to a liquid inside the heat-radiating flowpath 20 (liquid having a lower temperature than the liquid inside the cooling flowpath 22) so as to cool the liquid inside the cooling flowpath 22. A valve 19 is provided in the heat-radiating flowpath 20 as illustrated in FIG. 1. With this configuration, the heat radiating performance of the heat exchanger 16 may be changed by changing the degree of opening of the valve 19. Hereafter, unless stated otherwise, as an example, it will be assumed that the heat radiating performance of the heat exchanger 16 may be changed.

A liquid (coolant) flows through the cooling flowpath 22. The liquid may be any suitable liquid coolant such as water or ethylene glycol. A pump 12 and a liquid temperature meter 14 (example of liquid temperature measuring device) are provided along the cooling flowpath 22. Boards (motherboards) 32A, 32B, 32C, and 32D on which heat-generating components 34 (will be described later) are mounted are provided along the cooling flowpath 22. The liquid inside the cooling flowpath 22 cools the heat-generating components 34 on the boards 32A, 32B, 32C, and 32D. In the example illustrated in FIG. 1, four boards 32A, 32B, 32C, and 32D are illustrated, but any appropriate number of boards may be provided.

The pump 12 pumps the liquid inside the cooling flowpath 22, thereby causing the liquid inside the cooling flowpath 22 to circulate. Thus, the liquid inside the cooling flowpath 22 that has been cooled by the heat exchanger 16 is used to cool the heat-generating components 34 on the boards 32A, 32B, 32C, and 32D. The output (rotational speed) of the pump 12 may be fixed or variable. When the output of the pump 12 changes, the flow rate of the liquid flowing inside the cooling flowpath 22 changes in accordance with that change. Hereafter, unless stated otherwise, as an example, it will be assumed that the output of the pump 12 may be varied.

The liquid temperature meter 14 measures the temperature of the liquid flowing inside the cooling flowpath 22. It is preferable that the liquid temperature meter 14 be arranged at a position at which it is able to measure the temperature of the liquid being used to cool a heat-generating body which will be described later. That is, it is preferable that the liquid temperature meter 14 be provided upstream of a heat-generating body which will be described later and that another heat-generating object (heat-generating object causing a change in temperature) not be provided between the heat-generating body which will be described later and the liquid temperature meter 14. In the example illustrated in FIG. 1, the liquid temperature meter 14 is provided downstream of the heat exchanger 16 and upstream of the pump 12, but may instead be provided downstream of the heat exchanger 16 and the pump 12 and upstream of the board 32A.

The computer 30 may be any suitable type of information processing apparatus and for example may be a server or a super computer. The computer 30 includes heat-generating components 34 (refer to FIG. 2) thereinside. The heat-generating components 34 consist of a various electronic components used to realize the functions of the computer 30 and for example may include components that generate a lot of heat such as large scale integrated circuits (i) such as central processing units (CPUs) and interconnect chips (ICCs) or point of load (POL) DC-DC converters. The cooling flowpath 22 is arranged inside the computer 30 in order to cool the heat-generating components 34.

Figure 2:
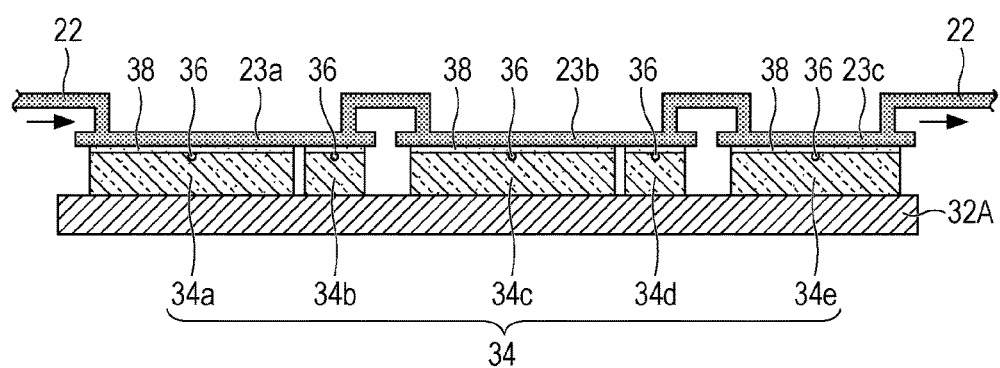
FIG. 2 illustrates an example of a form of cooling inside a computer.

FIG. 2 illustrates an example of a form of cooling inside the computer 30 realized by the cooling flowpath 22. In FIG. 2, the form of cooling for the board 32A is illustrated as a cross sectional view as an example. In FIG. 2, the direction in which the liquid flows in the cooling flowpath 22 is schematically illustrated with arrows.

In the example illustrated in FIG. 2, five heat-generating components 34 (34a to 34e) are mounted on the board 32A. The heat-generating components 34 may be for example CPUs, ICCs or POLs as mentioned above. A temperature meter 36 (an example of a temperature measuring device) is provided for each of the heat-generating components 34. Each temperature meter 36 measures the temperature of the corresponding heat-generating component 34. At this time, each temperature meter 36 may measure the temperature in the vicinity of a front surface of the corresponding heat-generating component 34 (surface on same side as water cushions 23a, 23b, and 23c). In addition, the water cushions (liquid cooling jackets) 23a, 23b, and 23c are attached to corresponding ones of the heat-generating components 34 with a high thermal conductivity material 38 such as a thermal sheet or grease interposed therebetween. The water cushions 23a, 23b, and 23c are connected to the cooling flowpath 22 and the liquid flows thereinside. The water cushions 23a, 23b, and 23c may be formed as part of the cooling flowpath 22. In the example illustrated in FIG. 2, the water cushions 23a and 23b are each formed so as to correspond to two of the heat-generating components 34 and the water cushion 23c is formed so as to correspond to a single heat-generating component 34.

The cooling method used to cool the heat-generating components 34 may be any suitable cooling method and the example illustrated in FIG. 2 is merely an example. For example, in the example illustrated in FIG. 2, the water cushions 23a, 23b, and 23c are connected in series with the cooling flowpath 22, but they may instead be connected in parallel with the cooling flowpath 22. For example, the cooling flowpath 22 may branch into three flowpaths on the inlet side, the three flowpaths may be connected to the water cushions 23a, 23b, and 23c, and the three flowpaths may merge again on the outlet side. In addition, in the example illustrated in FIG. 1, the cooling flowpath 22 is connected in series with the boards 32A, 32B, 32C, and 32D, but may instead be connected in parallel with the boards 32A, 32B, 32C, and 32D. For example, the cooling flowpath 22 may branch into four flowpaths upstream of the boards 32A, 32B, 32C, and 32D, the four flowpaths may then pass through the boards 32A, 32B, 32C, and 32D, and the four flowpaths may then merge again downstream of the boards 32A, 32B, 32C, and 32D.

Figure 3:
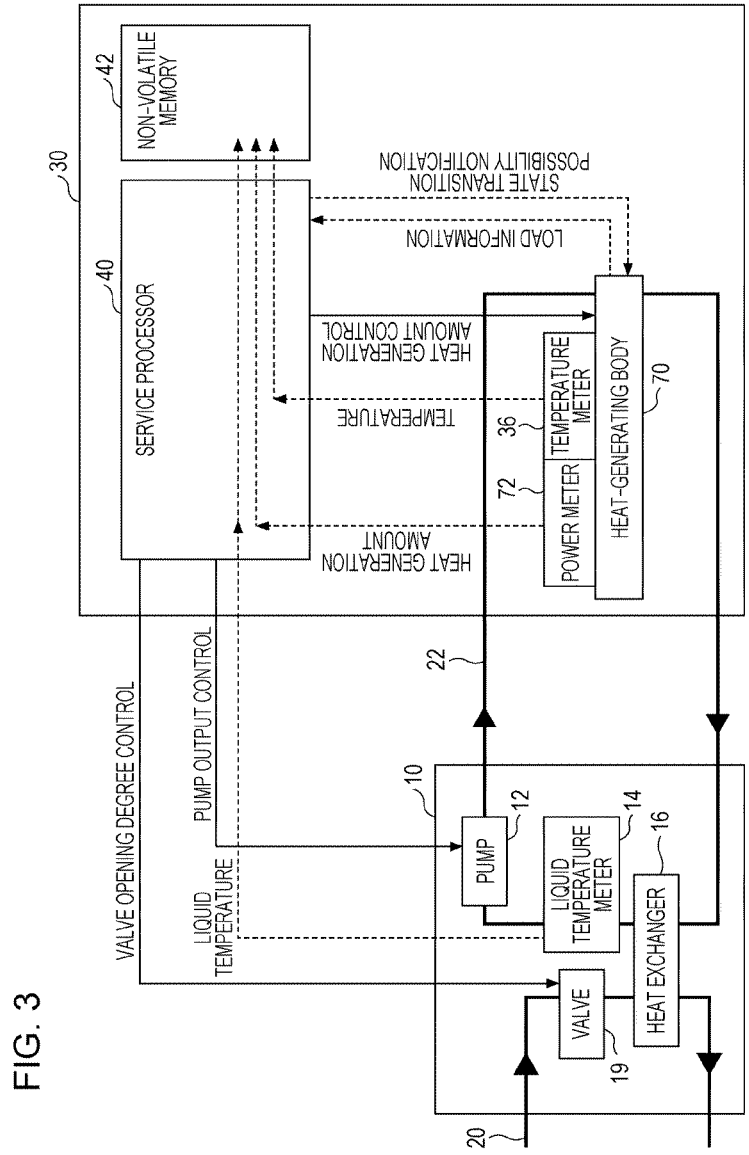
FIG. 3 illustrates parts of the configuration relevant to control of the electronic apparatus according to the embodiment.
Figures 4, 5:
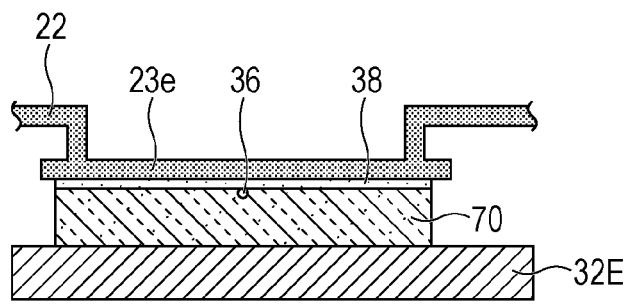
FIG. 4 illustrates an example of a heat-generating body that is provided separately from heat-generating components.
FIG. 5 is a table illustrating an example of table information inside a non-volatile memory.

FIG. 3 illustrates the parts of the configuration relevant to control of the electronic apparatus 1 according to the embodiment. FIG. 4 illustrates an example of a heat-generating body provided separately from the heat-generating components 34.

The electronic apparatus 1 includes a service processor (example of processing apparatus) 40 and a non-volatile memory 42 (example of a storage apparatus).

The service processor 40 may be formed of any type of suitable computer. The various functions of the service processor 40 (including functions that will be described later) may be realized by any suitable hardware, software, firmware or combination thereof. The various functions of the service processor 40, which will be described below, may be realized by causing the service processor 40 to execute a program inside the non-volatile memory 42. In addition, the program may be recorded on a recording medium, the recording medium on which the program is recorded may be read by the service processor 40, and thereby the various processing operations described below may be realized. The recording medium may be any suitable recording medium such as a recording medium on which information is recorded optically, electrically or electromagnetically such as a compact disc (CD)-read only memory (ROM), a floppy disk, or a magneto-optical disk, or a semiconductor memory on which information is electrically recorded such as a ROM or a flash memory. Carrier waves are not included in the examples of the recording medium.

The non-volatile memory 42 may be any suitable non-volatile memory and may be for example a ROM, an electrically erasable programmable ROM (EEPROM), or a hard disk drive. The non-volatile memory 42 may be formed of a plurality of non-volatile memories. The service processor 40 and the non-volatile memory 42 may be formed of elements (components) other than the heat-generating components 34 (refer to FIG. 2) or may be formed of the heat-generating components 34.

The service processor 40 obtains from a heat-generating body 70 information regarding a heat generation amount of the heat-generating body 70 (hereafter referred to as heat generation amount information) and information regarding a temperature of the heat-generating body 70 (hereafter referred to as heat-generating-body temperature information). The service processor 40 may perform heat generation amount control in order to control the heat generation amount of the heat-generating body 70. An example of such heat generation amount control will be described later.

The heat-generating body 70 may be made up of the heat-generating components 34 (refer to FIG. 2). In that case, the heat-generating body 70 may be made up of one of the plurality of heat-generating components 34 (for example the heat-generating component 34a in FIG. 3) or may be made up of all of the plurality of heat-generating components 34 on a certain single board (for example the heat-generating components 34a to 34e on the board 32A in FIG. 3). In addition, the heat-generating body 70 may be made up of all of the heat-generating components 34 on a plurality of boards 32 (for example the boards 32A, 32B, 32C, and 32D). Thus, units in which the heat-generating components serve as the heat-generating body 70 (units of heat-generating components, units of boards, units of computers) may be whatever is appropriate. Hereafter, unless stated otherwise, it will be assumed that, as an example, the heat-generating body 70 is the heat-generating component 34a, which is the heat-generating component 34 located furthest upstream along the cooling flowpath 22 among the heat-generating components 34a to 34e on the board 32A in FIG. 3.

Alternatively, the heat-generating body 70 may be provided separately from the heat-generating components 34 as illustrated in FIG. 4. That is, the heat-generating body 70 may be a heat-generating body (heat-generating body used for calculation of flow rate) that is not directly related to the processing functions of the computer 30. In this case as well, the heat-generating body 70 is provided so as to be cooled by the cooling flowpath 22. The heat-generating body 70 may be provided upstream of the most-upstream heat-generating component 34, may be provided downstream of the most-downstream heat-generating component 34 or may be provided at a position between any two heat-generating components 34. The heat-generating body 70, as illustrated in FIG. 4 may be provided with respect to the cooling flowpath 22 in a similar state to the heat-generating components 34. That is, as illustrated in FIG. 4, the heat-generating body 70 may be provided with a temperature meter 36 and may have a water cushion 23e attached thereto with a high thermal conductivity material 38 therebetween. Similarly to the water cushion 23a and so forth, the water cushion 23e is connected to the cooling flowpath 22 and a liquid flows thereinside. In addition, in this case, the heat-generating body 70 is provided downstream of the liquid temperature meter 14 in a state in which there is no other heat-generating object (for example a heat-generating component 34) between the liquid temperature meter 14 and the heat-generating body 70.

The heat generation amount information may be obtained from a power meter 72 (one example of a heat generation amount measuring device) provided on the heat-generating body 70. The power meter 72 may include a current sensor and a voltage sensor. In this case, the service processor 40 calculates the product of a voltage and a current applied to the heat-generating body 70 from heat generation amount information obtained from the power meter 72 and calculates the heat generation amount of the heat-generating body 70. That is, the service processor 40 calculates the heat generation amount of the heat-generating body 70 by converting the power obtained from the power meter 72. Alternatively, the service processor 40 may calculate the heat generation amount of the heat-generating body 70 by using respective control values for the voltage and the current applied to the heat-generating body 70. Alternatively, if there is a connection between the heat generation amount of the heat-generating body 70 and the processing content of the heat-generating body 70 (job), the service processor 40 may calculate the heat generation amount of the heat-generating body 70 based on the processing content of the heat-generating body 70. Calculation of the heat generation amount of the heat-generating body 70 may be performed in the heat-generating body 70 rather than in the service processor 40.

The heat-generating-body temperature information may be obtained by the temperature meter 36 (refer to FIG. 2) provided on the heat-generating body 70. The temperature meter 36 may be formed of a thermoelectrometer (thermocouple) for example.

The service processor 40 obtains information regarding the temperature (liquid temperature) of the liquid (hereafter, liquid temperature information) from the liquid temperature meter 14 as illustrated in FIG. 3.

The service processor 40 calculates the flow rate (volumetric flow rate) inside the cooling flowpath 22 based on the obtained heat generation amount information, heat-generating-body temperature information, and liquid temperature information, and based on table information inside the non-volatile memory 42. The table information and the method of calculating the flow rate will be described below. The service processor 40 may perform various control operations based on the calculated flow rate. The various control operations may include for example pump output control in which the output of the pump 12 is changed and valve opening degree control in which the heat radiating performance of the heat exchanger 16 is changed. These example control operations will be described below.

The service processor 40 may in addition obtain load information from the heat-generating body 70 as illustrated in FIG. 3. The load information may include for example a request to increase the heat generation amount of the heat-generating body 70 (load increase request) and a report regarding a decrease in the heat generation amount of the heat-generating body 70 (load decrease report). The service processor 40 may perform pump output control and valve opening degree control based on the load information. These example control operations will be described below.

Figure 6:
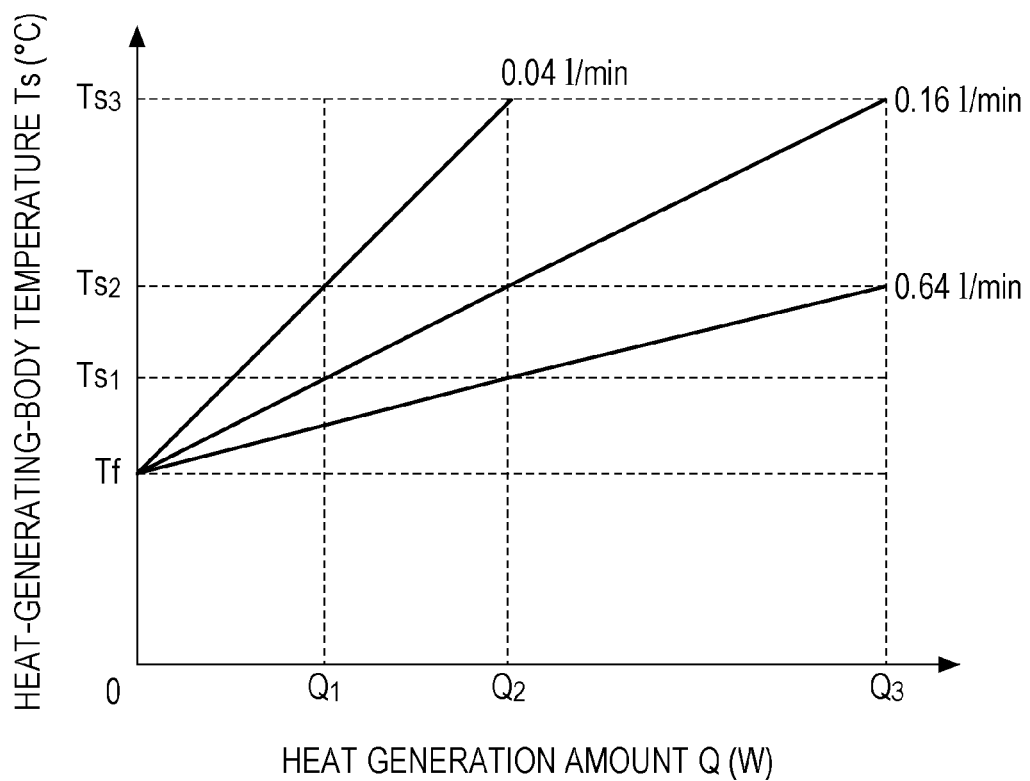
FIG. 6 illustrates examples of a relationship between a heat-generating-body temperature, a heat generation amount and a flow rate at a certain liquid temperature.

FIG. 5 is a table illustrating an example of table information inside the non-volatile memory 42. FIG. 6 illustrates examples of a relationship between a heat-generating-body temperature Ts, a heat generation amount Q, and a flow rate u at a certain liquid temperature Tf. The relationships illustrated in FIG. 6 are plotted as graphs using the table information illustrated in FIG. 5.

The table information illustrated in FIG. 5 represents relationships between the temperature (heat-generating-body temperature) Ts of the heat-generating body 70, the heat generation amount Q of the heat-generating body 70, and the flow rate u inside the cooling flowpath 22 for a certain liquid temperature Tf. In FIG. 5, three heat-generating body temperatures $Ts_1$, $Ts_2$, and $Ts_3$ are defined for the heat-generating-body temperature Ts, three heat generation amounts $Q_1$, $Q_2$, and $Q_3$ are defined for the heat generation amount Q of the heat-generating body 70, and the flow rates u are defined with a total of nine (3×3) combinations of the heat-generating-body temperature Ts and the heat generation amount Q. For example, a flow rate $u_{12}$ indicates a flow rate u at a time when the heat-generating-body temperature Ts is $Ts_1$ and the heat generation amount Q of the heat-generating body 70 is $Q_2$. The specific numerical values of flow rates u illustrated in FIG. 5 are merely examples.

Here, generally, a heat generation amount Q radiated from a heat-generating body in contact with a flowing coolant may be expressed using the following equation.

$$Q=h(Ts-Tf)S \qquad \text{Equation (1)}$$

Here, h is the convective heat transfer coefficient, Ts is the surface temperature of the heat-generating body, Tf is the temperature of the coolant, and S is the area of contact between the heat-generating body and the coolant. In addition, the following relation is known, where Nu is the Nusselt number, Re is the Reynolds number, and Pr is the Prandtl number.

$$Nu=f(Re,Pr) \qquad \text{Equation (2)}$$

Here, $Nu=hl/\lambda$, $Re=vl/\nu$, and $Pr=\nu/\alpha$, where l is the scale length, $\lambda$ is the thermal conductivity of the coolant, v is the flow velocity of the coolant, $\nu$ is the dynamic coefficient of viscosity of the coolant, and $\alpha$ is the thermal diffusivity. $\lambda$, $\nu$, and $\alpha$ are values unique to a material and have a temperature dependence. Therefore, the Reynolds number Re may be expressed as a function of the flow velocity v and the temperature Tf of the coolant as follows.

$$Re=f(v,Tf) \qquad \text{Equation (3)}$$

In addition, the Prandtl number Pr may be expressed as a function of the temperature Tf of the coolant as follows.

$$Pr=f(Tf) \qquad \text{Equation (4)}$$

Therefore, from (2), (3), and (4) and the definition of the Nusselt number ($Nu=hl/\lambda$), the convective heat transfer coefficient h may be expressed as a function of the flow velocity v and the temperature Tf of the coolant.

$$h=f(v,Tf) \qquad \text{Equation (5)}$$

From Equation (1) and Equation (5), in an environment in which there is a certain fixed contact area S, the following equation is obtained.

$$v=f(Q,Ts,Tf) \qquad \text{Equation (6)}$$

Therefore, it is clear that the flow velocity v of the coolant may be expressed using the heat generation amount Q, the surface temperature Ts, and the temperature Tf of the coolant. In the case of laminar flow flowing over a flat plate having a uniform temperature, it is known that the Nusselt number Nu is as follows. It is known that $$Nu=0.664Re^{1/2}Pr^{1/3} (Re<3\times10^5) \qquad \text{Equation (7)}$$

and if Equation (7) is modified, then the following is obtained.

$$Q=0.664Re^{1/2}Pr^{1/3}(\lambda/l)(Ts-Tf)S \qquad \text{Equation (8)}$$

Thus, the flow rate u of the liquid inside the cooling flowpath 22 may be expressed as a function of the heat generation amount Q of the heat-generating body 70, the heat-generating-body temperature Ts, and the temperature (liquid temperature) Tf of the liquid inside the cooling flowpath 22. Therefore, the flow rate u of the liquid may be calculated from the heat generation amount information, the heat-generating-body temperature information, and the liquid temperature information by preparing table information such as illustrated in FIG. 5 for each liquid temperature Tf for a plurality of liquid temperatures Tf. In the example illustrated in FIG. 5, for a certain liquid temperature Tf, flow rates u are defined for a total of nine combinations of heat-generating-body temperature Ts and heat generation amount Q, but any number of combinations of heat-generating-body temperature Ts and heat generation amount Q may be used. Generally, the greater the number of combinations, the higher the accuracy, but the flow rate u of the liquid may be calculated for combinations of heat-generating-body temperature Ts and heat generation amount Q not included in the table information by using interpolation.

As is clear from Equation (8), the relationship between the heat generation amount Q and the heat-generating-body temperature Ts for certain fixed flow rates may be linearly approximated as illustrated in FIG. 6. For example, in the examples illustrated in FIG. 5 and FIG. 6, for a flow rate u=0.16 l/min, Ts=0.5Q+20 may be approximated. Therefore, as table information, a relational expression (approximation equation) between the heat generation amount Q and the heat-generating-body temperature Ts may be maintained for each flow rate u and each liquid temperature Tf.

Here, table information such as that illustrated in FIG. 5 may be calculated through computation (simulation) in advance (at the design stage), but is preferably obtained in advance based on test data.

Figure 7:
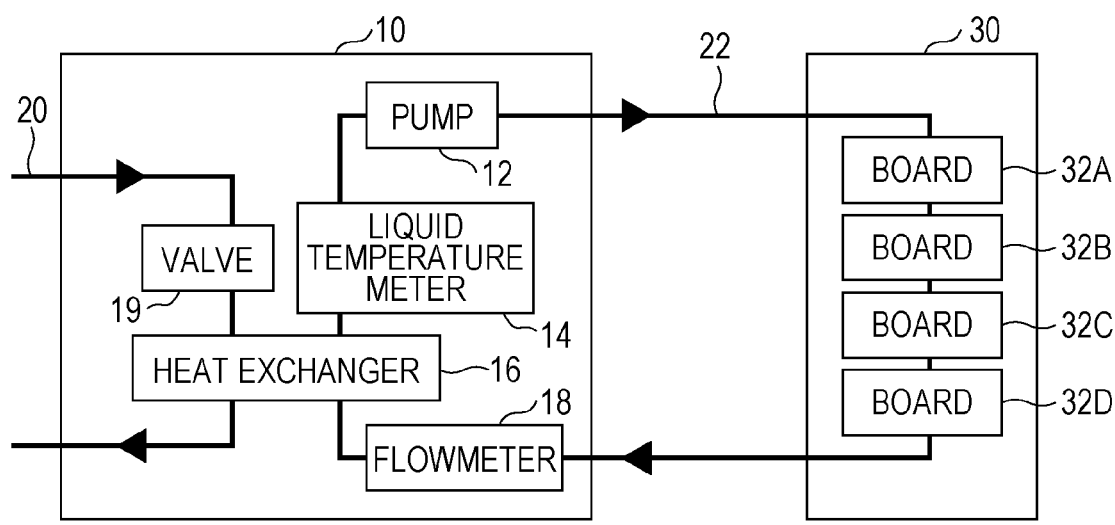
FIG. 7 illustrates an example of a configuration of the electronic apparatus when table information is being obtained via a test.

FIG. 7 illustrates an example of a configuration of the electronic apparatus 1 when obtaining the table information via a test.

As illustrated in FIG. 7, a flowmeter 18 is provided in the cooling flowpath 22 when obtaining table information via a test. The flowmeter 18 measures the flow rate of the liquid flowing in the cooling flowpath 22. The flowmeter 18 may be installed at any appropriate position. For example, the flowmeter 18 may be installed at a position such that the measured flow rate has a one-to-one relationship with the flow velocity (flow velocity in water cushions 23a) of the liquid used in cooling of the heat-generating body 70 (heat-generating component 34a). The flowmeter 18 is merely for obtaining table information (at the design stage) and the electronic apparatus 1 does not have to include the flowmeter 18 when in practical use. The table information obtaining processing may be performed by every electronic apparatus 1, or may be performed for any single one electronic apparatus 1 (or test electronic apparatus 1) for the same model of electronic apparatus 1. In the latter case, the obtained table information may be used by other electronic apparatuses 1 of the same model.

Figure 8:
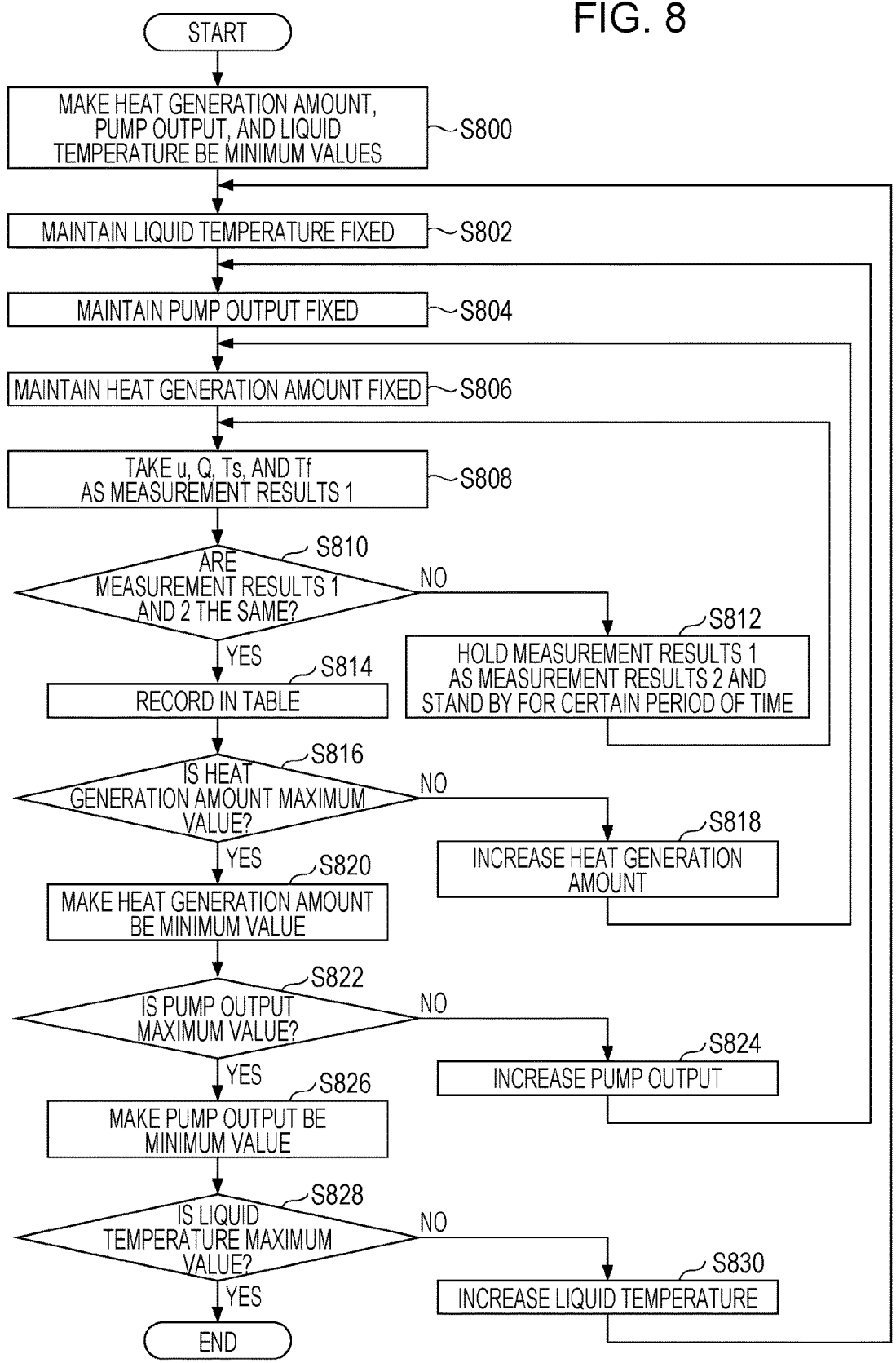
FIG. 8 is a flowchart illustrating an example of table information obtaining processing using the configuration illustrated in FIG. 7.

FIG. 8 is a flowchart illustrating an example of table information obtaining processing using the configuration illustrated in FIG. 7. The table information obtaining processing illustrated in FIG. 8 may be performed by the service processor 40 (refer to FIG. 3). Here, it is assumed that the heat generation amount of the heat-generating body 70 may vary within a certain range of variation, that the output of the pump 12 may vary within a certain range of variation, and that the liquid temperature may vary within a certain range of variation. These certain ranges of variation may correspond to the ranges of variation of these parameters at the time of practical use.

In step 800, the heat generation amount of the heat-generating body 70, the output of the pump 12, and the liquid temperature are made to be minimum values within the respective ranges of variation.

In step 802, the liquid temperature is maintained fixed by controlling the degree of opening of the valve. In the case where the liquid temperature is made to increase in step 830, which will be described later, the liquid temperature is maintained fixed at the increased value.

In step 804, the output of the pump 12 is maintained fixed by performing pump output control. In the case where the output of the pump 12 is made to increase in step 824, which will be described later, the output of the pump 12 is maintained fixed at the increased value.

In step 806, the heat generation amount of the heat-generating body 70 is maintained fixed. In the case where the heat generation amount of the heat-generating body 70 is made to increase in step 818, which will be described later, the heat generation amount of the heat-generating body 70 is maintained fixed at the increased value. The heat generation amount of the heat-generating body 70 may be maintained fixed by maintaining the voltage and the current applied (supplied) to the heat-generating body 70 fixed. Alternatively, in the case where the heat-generating body 70 is a CPU for example, the CPU may be made to perform a certain job continuously such that the heat generation amount of the CPU remains at a certain fixed value.

In step 808, along with a measured value of the flow rate being obtained from the flowmeter 18, liquid temperature information, heat generation amount information, and heat-generating-body temperature information are obtained, and the current flow rate u, heat generation amount Q, heat-generating-body temperature Ts and liquid temperature Tf are taken as measurement results 1.

In step 810, it is determined whether measurement results 1 and measurements results 2 are the same. There are no measurement results 2 in the first processing period after a parameter has changed in step 818, step 824 or step 830, which will be described later, and therefore a negative determination is made in this case. In the case where the measurement results 1 and the measurement results 2 are the same, the processing proceeds to step 814, and otherwise the processing proceeds to step 812.

In step 812, the measurement results 1 are held as the measurement results 2 and the processing returns to step 808 after standing by for a certain period of time. Thus, standing by is performed until the flow rate u, the heat generation amount Q, the heat-generating-body temperature Ts, and the liquid temperature Tf stabilize (converge). Once the flow rate u, the heat generation amount Q, the heat-generating-body temperature Ts, and the liquid temperature Tf have stabilized, a positive determination is made in step 810 and the processing proceeds to step 814.

In step 814, the current measurement results (measurement results after stabilization) are stored as table information in a table (certain region in the non-volatile memory 42).

In step 816, it is determined whether the heat generation amount of the heat-generating body 70 is a maximum value within the certain range of variation. In the case where the heat generation amount of the heat-generating body 70 is the maximum value, the processing proceeds to step 820, or otherwise the processing proceeds to step 818.

In step 818, the heat generation amount of the heat-generating body 70 is increased by a certain amount and the processing returns to step 806. The certain amount may be any appropriate amount and is an amount of change of the heat generation amount of the heat-generating body 70 in the table information. The certain amount may be decided upon in accordance with for example the desired degree of accuracy with which the flow rate is to be calculated and the amount of time allowed for the table information obtaining processing. Thus, the table information is obtained for each heat generation amount while the heat generation amount of the heat-generating body 70 is increased by a certain amount.

In step 820, the heat generation amount of the heat-generating body 70 is made to be a minimum value within the certain range of variation.

In step 822, it is determined whether or not the output of the pump 12 is a maximum value within the certain range of variation. In the case where the output of the pump 12 is a maximum value, the processing proceeds to step 826, and otherwise the processing proceeds to step 824.

In step 824, the output of the pump 12 is increased by a certain amount and the processing returns to step 804. The certain amount is any appropriate amount and substantially corresponds to an amount of change of the flow rate in the table information. The certain amount may be decided upon in accordance with for example the desired degree of accuracy with which the flow rate is to be calculated and the amount of time allowed for the table information obtaining processing. Thus, while the output of the pump 12 is increased by the certain amount, the table information is obtained for each flow rate, which has been changed as a result of the output of the pump 12 being changed.

In step 826, the output of the pump 12 is made to be a minimum value within the certain range of variation.

In step 828, it is determined whether or not the liquid temperature is a maximum value within the certain range of variation. In other words, it is determined whether or not the degree of opening of the valve 19 is minimum. In the case where the liquid temperature is a maximum value within the certain range of variation, the processing is terminated, and otherwise the processing proceeds to step 830.

In step 830, the liquid temperature is increased by a certain amount (that is, the degree of opening of the valve 19 is decreased by a certain degree of opening), and then the processing returns to step 802. The certain amount is any appropriate amount and substantially corresponding to an amount of change of the liquid temperature in the table information. The certain amount may be decided upon in accordance with for example the desired degree of accuracy with which the flow rate is to be calculated and the amount of time allowed for the table information obtaining processing. Thus, the table information is obtained for each liquid temperature while the liquid temperature is increased by a certain amount.

With the processing illustrated in FIG. 8, by changing the heat generation amount, the flow rate, and the liquid temperature as parameters, measured values of the flow rate u, the heat generation amount Q, the heat-generating-body temperature Ts, and the liquid temperature Tf may be obtained under various conditions (combinations of heat generation amount, flow rate, and liquid temperature). The obtained measured values are stored in the table as table information (certain region inside the non-volatile memory 42). Thus, at the time of practical use, it is possible to calculate the flow rate under various conditions (combinations of heat generation amount, heat-generating-body temperature, and liquid temperature) based on the table information inside the non-volatile memory 42.

Figure 9:
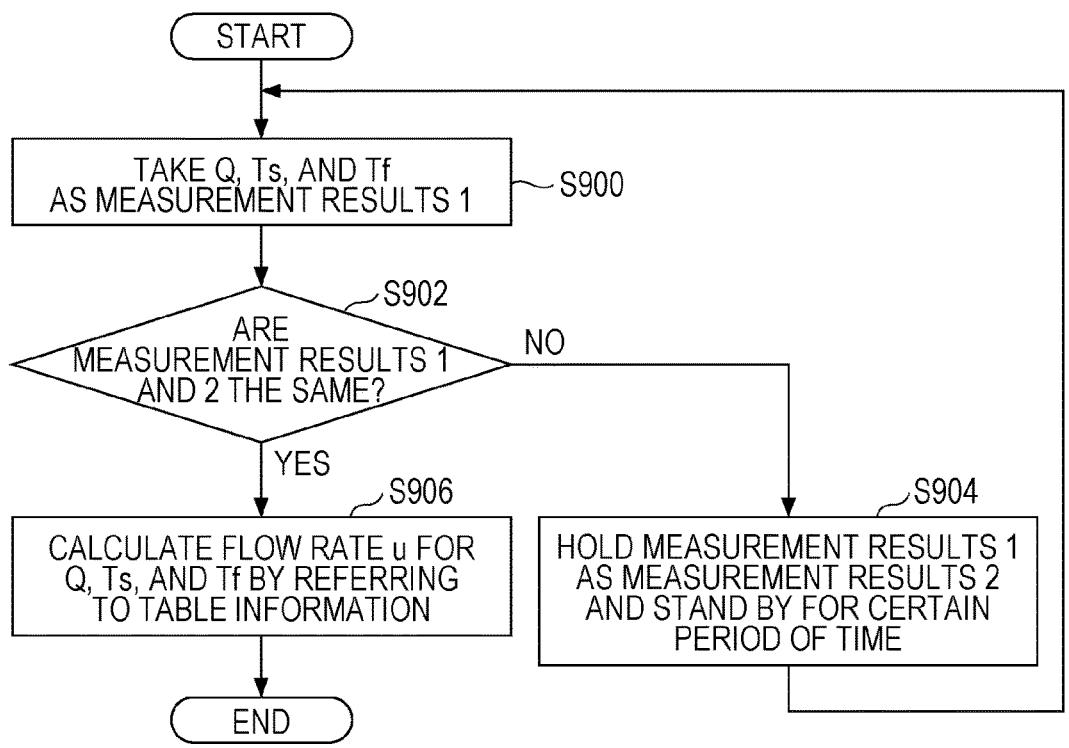
FIG. 9 is a flowchart illustrating an example of flow rate calculation processing that may be performed by a service processor at the time of practical use.

FIG. 9 is a flowchart illustrating an example of flow rate calculation processing that may be performed by the service processor 40 (refer to FIG. 3) at the time of practical use. At the time of practical use, as described above, the flowmeter 18 in the configuration illustrated in FIG. 7 is not used. The flow rate calculation processing illustrated in FIG. 9 may be performed at any suitable timing, and for example may be performed periodically or may be performed non-periodically (when desired).

In step 900, the liquid temperature information, the heat generation amount information and the heat-generating-body temperature information are obtained, and the current heat generation amount Q, heat-generating-body temperature Ts, and liquid temperature Tf are taken as measurement results 1.

In step 902, it is determined whether or not the measurement results 1 and measurements results 2 are the same. In addition, in the first processing period, since there are no measurement results 2, a negative determination is made in this case. In the case where the measurement results 1 and the measurement results 2 are the same, the processing proceeds to step 906 and otherwise the processing proceeds to step 904.

In step 904, the measurement results 1 are held as the measurement results 2 and the processing returns to step 900 after standing by for a certain period of time. Thus, standing by is performed until the heat generation amount Q, the heat-generating-body temperature Ts and the liquid temperature Tf stabilize (converge). Once the heat generation amount Q, the heat-generating-body temperature Ts and the liquid temperature Tf have stabilized, a positive determination is made in step 902 and the processing proceeds to step 906.

In step 906, the flow rate u for the heat generation amount Q, the heat-generating-body temperature Ts, and the liquid temperature Tf of the current measurement results is calculated by referring to the table information. For example, in the case where the table information illustrated in FIG. 5 is table information for Tf=20° C., the flow rate u may be calculated as 0.16 l/min when the current measurement results are Q=60 W, Ts=50° C., and Tf=20° C. In addition, at this time, in the case where there is no table information that corresponds to the heat generation amount Q, the heat-generating-body temperature Ts and the liquid temperature Tf of the current measurement results, the flow rate u may be calculated through interpolation using table information close to the current measurement results.

With the processing illustrated in FIG. 9, the flow rate u may be calculated based on the liquid temperature information, the heat generation amount information, and the heat-generating-body temperature information by referring to the table information. Therefore, at the time of practical use, the flow rate u may be calculated without using the flowmeter 18. Thus, it is possible to calculate the flow rate u of the liquid using a smaller number of components and with a comparatively simple configuration. In addition, it is possible to suppress for example an increase in power loss caused by the flowmeter 18 and an increase in maintenance cost related to the flowmeter 18. In addition, since one of the heat-generating components 34 inside the computer 30 is used as the heat-generating body 70, a special heat-generating body 70 is not used and the flow rate u may be calculated with a comparatively simple configuration.

The flow rate u calculated by the processing illustrated in FIG. 9 is the flow rate at a position at which the flowmeter 18 is installed in the cooling flowpath 22 when the table information is being obtained. Therefore, in the case where it is desired to calculate the flow velocity at another position in the cooling flowpath 22, the flow velocity may be calculated by using a ratio between the cross-sectional area at that other position and the cross-sectional area at the position at which the flowmeter 18 is installed in the cooling flowpath 22 when the table information is being obtained. Alternatively, the calculation may be performed when generating the table information. Thus, calculation of the flow rate and calculation of the flow velocity are practically equivalent.

Figure 10:
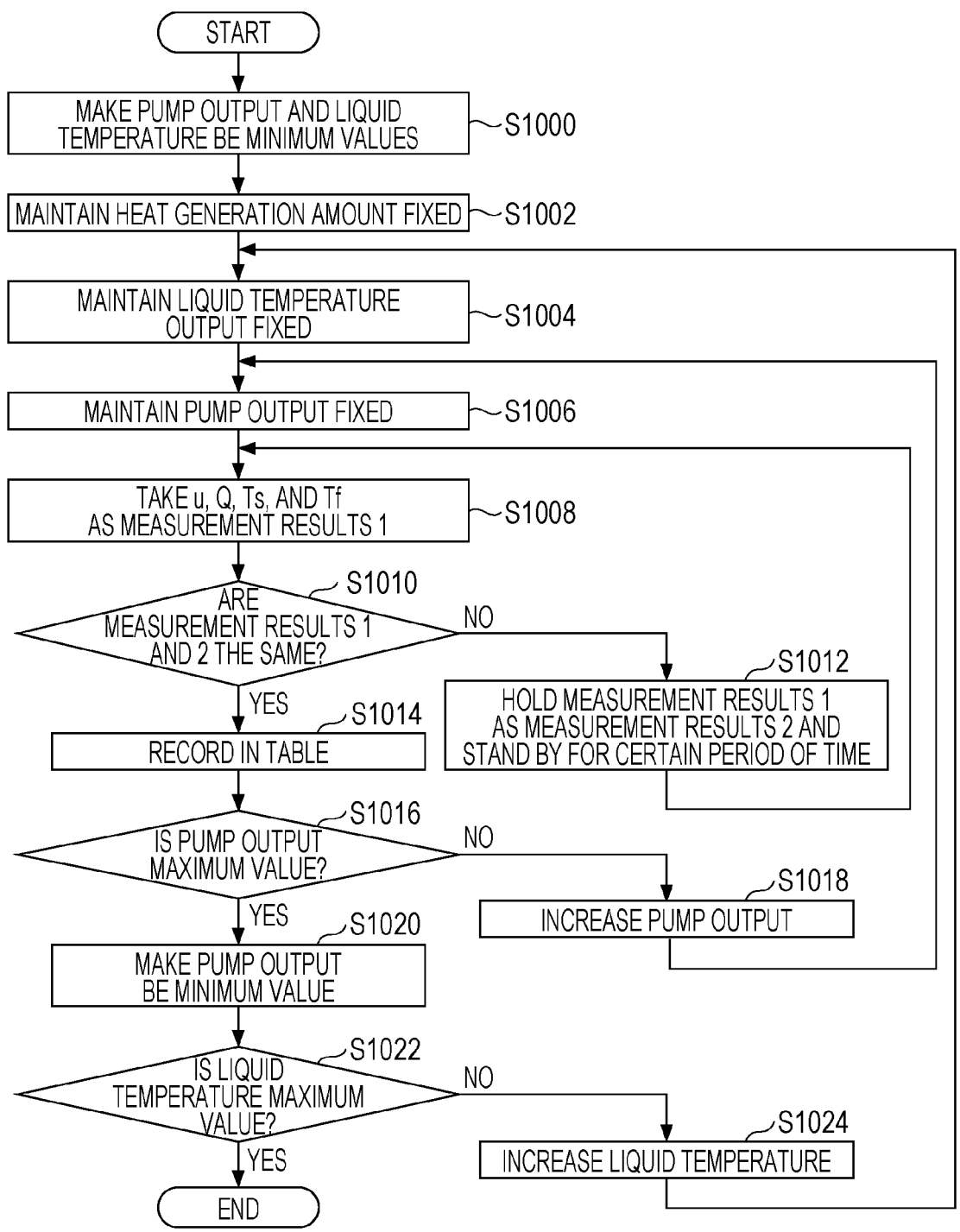
FIG. 10 is a flowchart illustrating an example of table information obtaining processing in a configuration in which a heat-generating body other than the heat-generating components inside a computer is newly provided.

FIG. 10 is a flowchart illustrating an example of table information obtaining processing in a configuration in which a heat-generating body 70 (refer to FIG. 4) that is a heat-generating body other than the heat-generating components 34 inside the computer 30 is newly provided. In the case of this configuration is well, the flowmeter 18 illustrated in FIG. 7 is provided in order to obtain the table information. The table information obtaining processing illustrated in FIG. 10 substantially differs from table information obtaining processing illustrated in FIG. 8 only in that the heat generation amount of the heat-generating body 70 is maintained at a certain value. This is because in the case where the heat-generating body 70, which is a heat-generating body other than the heat-generating components 34 inside the computer 30, is used, it is possible to maintain the heat generation amount of the heat-generating body 70 at a certain value (>0) regardless of the processing contents of the computer 30. When the table information obtaining processing is not being performed, the heat generation amount of the heat-generating body 70 may be maintained at zero.

In step 1000, the output of the pump 12 and the liquid temperature are made to be minimum values within the respective certain ranges of variation.

In step 1002, the heat generation amount of the heat-generating body 70 is maintained fixed (at a certain value). The certain value may be any value significantly larger than zero. As illustrated in FIG. 6, the larger the heat generation amount of the heat-generating body 70, the greater the difference in heat-generating-body temperature becomes for different flow rates, and therefore the accuracy with which the flow rate is calculated is improved by this amount. On the other hand, the larger the heat generation amount of the heat-generating body 70, the worse the thermal efficiency becomes. The certain value may be appropriately set with consideration of these contradictory factors. Maintaining of the heat generation amount of the heat-generating body 70 at the certain value may be realized by maintaining the applied voltage and current at certain values. Alternatively, in the case where the heat-generating body 70 is a CPU for example, the CPU may be made to perform a certain job continuously such that the heat generation amount of the CPU remains at the certain value.

In step 1004, the liquid temperature is maintained fixed by controlling the degree of opening of the valve.

In step 1006, the output of the pump 12 is maintained fixed by controlling the output of the pump.

In step 1008, along with a measured value of the flow rate being obtained from the flowmeter 18, liquid temperature information, heat generation amount information, and heat-generating-body temperature information are obtained, and the current flow rate u, heat generation amount Q, heat-generating-body temperature Ts, and liquid temperature Tf are taken as measurement results 1. As the heat generation amount Q, a certain value maintained in step 1002 may be used, or a control value or a measured value may be used.

In step 1010, it is determined whether or not the measurement results 1 and measurement results 2 are the same. In addition, in the first processing period after the parameters are changed, since there are no measurement results 2, a negative determination is made in this case. In the case where the measurement results 1 and the measurement results 2 are the same, the processing proceeds to step 1014 and otherwise the processing proceeds to step 1012.

In step 1012, the measurement results 1 are held as the measurement results 2 and the processing returns to step 1008 after standing by for a certain period of time. Thus, standing by is performed until the flow rate u, the heat-generating-body temperature Ts, and the liquid temperature Tf stabilize (converge). Once the flow rate u, the heat-generating-body temperature Ts, and the liquid temperature Tf have stabilized, a positive determination is made in step 1010 and the processing proceeds to step 1014.

In step 1014, the current measurement results are stored as table information in a table (certain region in the non-volatile memory 42).

In step 1016, it is determined whether or not the output of the pump 12 is a maximum value within the certain range of variation. In the case where the output of the pump 12 is a maximum value, the processing proceeds to step 1020, and otherwise the processing proceeds to step 1018.

In step 1018, the output of the pump 12 is increased by a certain amount and the processing returns to step 1006.

In step 1020, the output of the pump 12 is made to be a minimum value within the certain range of variation.

In step 1022, it is determined whether or not the liquid temperature is a maximum value within a certain range of variation. In the case where the liquid temperature is a maximum value within the certain range of variation, the processing is terminated, and otherwise the processing proceeds to step 1024.

In step 1024, the liquid temperature is increased by a certain amount (that is, the degree of opening of the valve 19 is decreased by a certain degree of opening), and then the processing returns to step 1004.

With the processing illustrated in FIG. 8, by maintaining the heat generation amount fixed and changing the flow rate and the liquid temperature as parameters, measured values of the flow rate u, the heat-generating-body temperature Ts, and the liquid temperature Tf may be obtained under various conditions (combinations of flow rate and liquid temperature) when the heat generation amount is a certain value. The obtained measured values are stored as table information in a table (certain region inside the non-volatile memory 42). This table information is information indicating the relationship between a certain heat generation amount, the flow rate u, the heat-generating-body temperature Ts, and the liquid temperature Tf. Thus, at the time of practical use, it is possible to calculate the flow rate under various conditions (combinations of heat-generating-body temperature and liquid temperature) based on the table information within the non-volatile memory 42 when the heat generation amount is a certain value.

Figure 11:
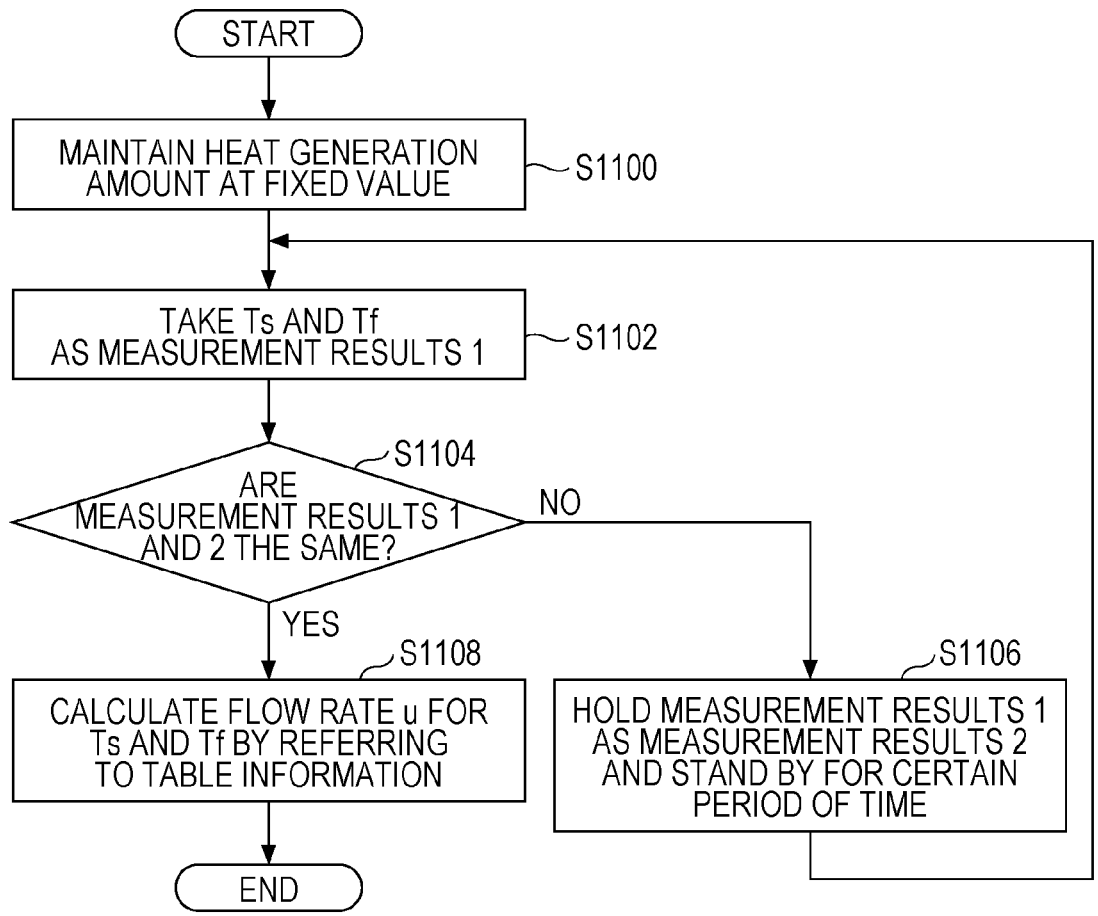
FIG. 11 is a flowchart illustrating an example of flow rate calculation processing performed at a time of practical use in a configuration in which a heat-generating body other than the heat-generating components inside the computer is newly provided.

FIG. 11 is a flowchart illustrating an example of flow rate calculation processing performed at a time of practical use in a configuration in which a heat-generating body 70 other than the heat-generating components 34 inside the computer 30 is newly provided. The flow rate calculation processing illustrated in FIG. 11 may be performed by the service processor 40 (refer to FIG. 3). The flow rate calculation processing illustrated in FIG. 11 may be performed at any suitable timing, and for example may be performed periodically or may be performed non-periodically.

In step 1100, the heat generation amount of the heat-generating body 70 is maintained fixed (at a certain value). The certain value is the same as the certain value used in step 1002 of the table information obtaining processing.

In step 1102, the liquid temperature information and the heat-generating-body temperature information are obtained and the current heat-generating-body temperature Ts and liquid temperature Tf are taken as measurement results 1.

In step 1104, it is determined whether the measurement results 1 and measurement results 2 are the same. In addition, in the first processing period, since there are no measurement results 2, a negative determination is made in this case. In the case where the measurement results 1 and the measurement results 2 are the same, the processing proceeds to step 1108 and otherwise the processing proceeds to step 1106.

In step 1106, the measurement results 1 are held as the measurement results 2 and the processing returns to step 1102 after standing by for a certain period of time. Thus, standing by is performed until the heat-generating-body temperature Ts and the liquid temperature Tf stabilize (converge). Once the heat-generating-body temperature Ts and the liquid temperature Tf have stabilized, a positive determination is made in step 1104 and the processing proceeds to step 1108.

In step 1108, the flow rate u with respect to the heat-generating-body temperature Ts and the liquid temperature Tf of the current measurement results is calculated by referring to the table information.

With the processing illustrated in FIG. 11, the flow rate u may be calculated by referring to the table information based on the liquid temperature information and the heat-generating-body temperature information. Therefore, at the time of practical use, the flow rate u may be calculated without using the flowmeter 18. Thus, along with reducing the number of components it is also possible to suppress for example an increase in power loss caused by the flowmeter 18 and an increase in maintenance cost related to the flowmeter 18. In addition, since it is possible to maintain the heat generation amount of the heat-generating body 70 at a certain value in the configuration in which the heat-generating body 70, which is a heat-generating body other than the heat-generating components 34 inside the computer 30, is provided, table information relating to the heat generation amounts of a plurality of heat-generating bodies 70 is not held and it is possible to reduce the amount of table information.

Figure 12:
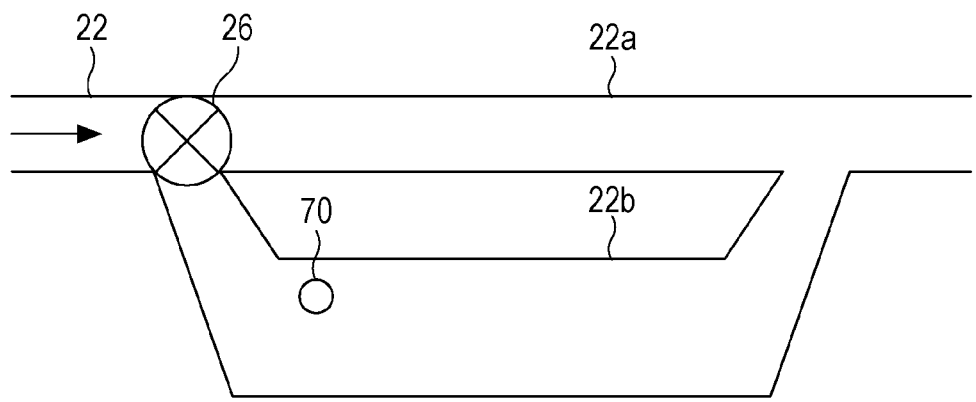
FIG. 12 illustrates an example of the arrangement of a heat-generating body in a configuration in which a heat-generating body other than the heat-generating components inside the computer is newly provided.

FIG. 12 illustrates an example of the arrangement of the heat-generating body 70 in a configuration in which the heat-generating body 70, which is a heat-generating body other than the heat-generating components 34 inside the computer 30, is newly provided.

In the configuration in which the heat-generating body 70, which is a heat-generating body other than the heat-generating components 34 inside the computer 30, is newly provided, the heat-generating body 70 may be provided in any suitable state with respect to the cooling flowpath 22, but is preferably provided in a second flowpath 22b that has a large cross-sectional area as illustrated in FIG. 12. Specifically, the cooling flowpath 22 branches into a first flowpath 22a and the second flowpath 22b, as illustrated in FIG. 12. The first flowpath 22a may have the same cross-sectional area as the cooling flowpath 22 before branching, and the second flowpath 22b has a larger cross-sectional area than the first flowpath 22a (than the cooling flowpath 22 before branching). The first flowpath 22a and the second flowpath 22b ultimately converge with each other. A valve 26 that switches between the first flowpath 22a and the second flowpath 22b is provided at a branching portion between the first flowpath 22a and the second flowpath 22b. Opening and closing of the valve 26 may be controlled by the service processor 40 (refer to FIG. 3).

The heat-generating body 70 is provided with respect to the second flowpath 22b as schematically illustrated in FIG. 12. That is, the heat-generating body 70 is provided so as to be cooled by liquid flowing through the second flowpath 22b. For example, the heat-generating body 70 may be provided with respect to the second flowpath 22b in the state illustrated in FIG. 4. As described above, the heat-generating body 70 may be provided upstream of the most-upstream heat-generating component 34, may be provided downstream of the most-downstream heat-generating component 34, or may be provided between any two of the heat-generating components 34. In addition, the heat-generating body 70 is provided with a temperature meter 36 that measures the temperature of the heat-generating body 70 (not illustrated in FIG. 12).

At the time of practical use, when performing flow rate calculation processing, the service processor 40 controls the valve 26 such that the liquid flows through the second flowpath 22b but does not flow through the first flowpath 22a. In this case, for example, in the flow rate calculation processing illustrated in FIG. 11, the flowpaths may be switched between by the valve 26 such that the liquid flows through the second flowpath 22b but does not flow through the first flowpath 22a as additional processing in step 1100. In addition, at the time of practical use, the service processor 40 may control the valve 26 such that the liquid flows through the first flowpath 22a but does not flow through the second flowpath 22b at times other than when performing the flow rate calculation processing.

In the arrangement example illustrated in FIG. 12, the cross-sectional area of the second flowpath 22b is larger than the cross-sectional area of the first flowpath 22a and therefore the flow velocity of the liquid flowing through the second flowpath 22b is smaller than the flow velocity of the liquid flowing through the first flowpath 22a. As is clear from the above Equation (8), if the flow velocity is small, the temperature difference (Ts−Tf) is large. Therefore, the effect of measurement errors in the temperature difference (Ts−Tf) becomes smaller the smaller the flow velocity becomes and the accuracy with which the flow rate u is calculated is improved the smaller the flow velocity. In addition, as is clear from FIG. 6, the amount of change in the heat-generating-body temperature with respect to a change in heat generation amount becomes larger the smaller the flow rate is, and therefore the effect of measurement errors in the heat-generating-body temperature becomes smaller, the smaller the flow rate becomes. Therefore, with the example arrangement illustrated in FIG. 12, the accuracy with which the flow rate u in the second flowpath 22b is calculated may be improved.

In the example arrangement illustrated in FIG. 12, if the cross sectional areas of the first flowpath 22a and the second flowpath 22b are measured in advance (or already known in advance as design information), the flow velocity in the first flowpath 22a may be calculated from the flow velocity in the second flowpath 22b. For example, if the ratio of the cross sectional areas of the first flowpath 22a to the second flowpath 22b is 1:4, the flow velocity in the first flowpath 22a may be calculated as four times the flow velocity in the second flowpath.

Next, examples of various control operations of the service processor 40 at the time of practical use will be described.

Figure 13:
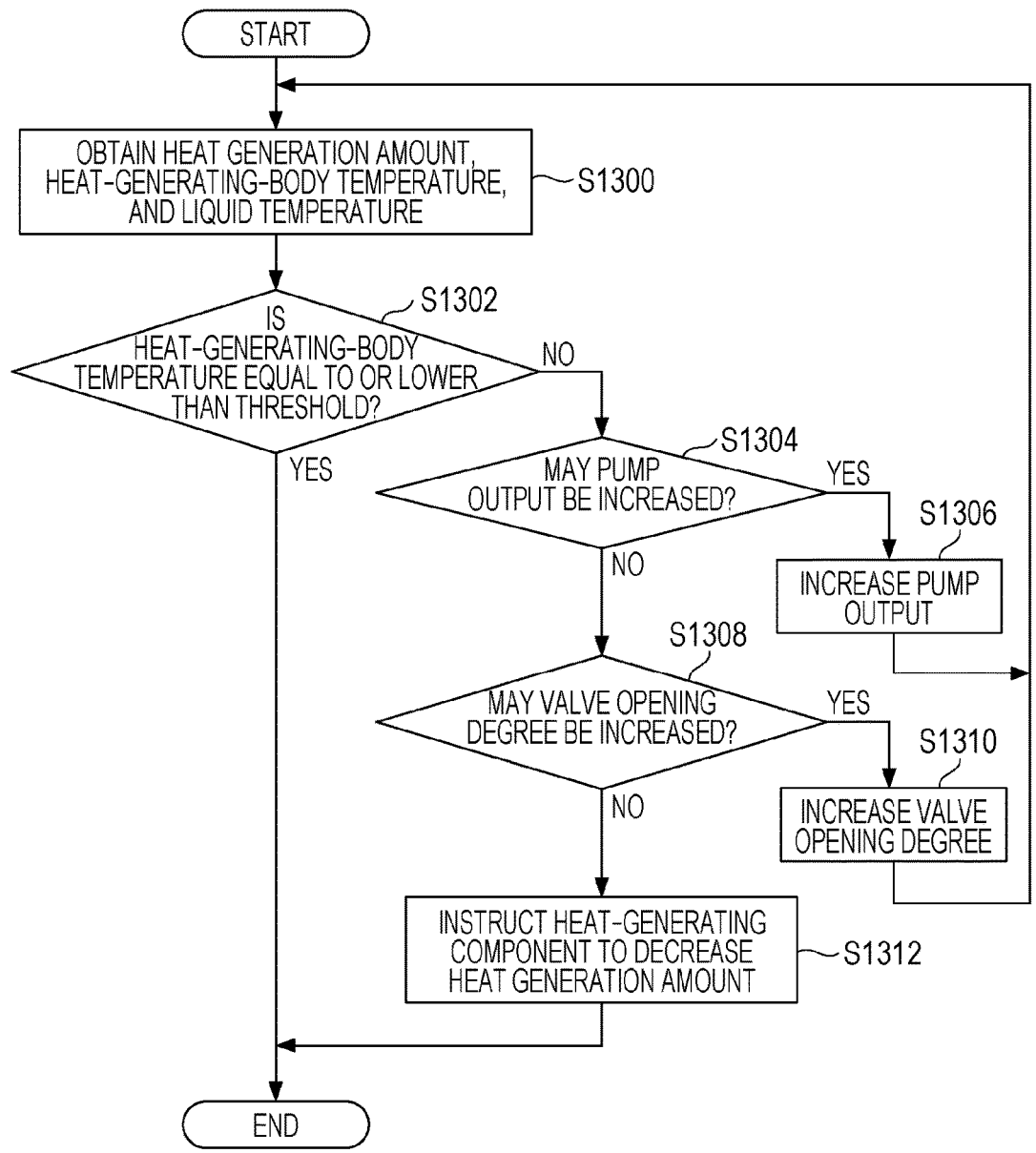
FIG. 13 is a flowchart illustrating an example of heat generation amount restriction processing that may be performed by the service processor.

FIG. 13 is a flowchart illustrating an example of heat generation amount control (heat generation amount restriction processing) that may be performed by the service processor 40. Here, as an example, the heat-generating body 70 is assumed to be the heat-generating component 34a (refer to FIG. 2).

In step 1300, heat generation amount information, heat-generating-body temperature information, and liquid temperature information are obtained. The heat generation amount information and the heat-generating-body temperature information are respectively pieces of information regarding the heat generation amount and the temperature of the heat-generating component 34a.

In step 1302, a determination is made as to whether the current temperature of the heat-generating body 70 (heat-generating component 34a) is equal to or less than a certain threshold Th1 based on the heat-generating-body temperature information obtained in step 1300. The certain threshold Th1 may be a threshold determined from the viewpoint of inhibiting breakdown of or occurrence of abnormalities in the heat-generating body 70. For example, the certain threshold Th1 may correspond to an upper limit of temperature range in which breakdown or abnormalities do not occur in the heat-generating body 70 and may be adjusted through tests and so forth. The certain threshold Th1 may be set in accordance with characteristics of the heat-generating body 70. In the case where the heat-generating-body temperature is equal to or less than the certain threshold Th1, the processing is terminated and otherwise the processing proceeds to step 1304.

In step 1304, it is determined whether the output of the pump 12 may be increased. In the case where the output of the pump 12 may be increased (that is, in the case where the output of the pump 12 is not a maximum value within a certain range of variation), the processing proceeds to step 1306 and otherwise the processing proceeds to step 1308.

In step 1306, the output of the pump 12 is increased by a certain amount ΔPout and the processing returns to step 1300. The certain amount ΔPout may be any suitable amount and may be varied so as to become larger the larger the absolute value of the difference between the heat-generating-body temperature and the certain threshold Th1 becomes. In addition, the certain amount ΔPout may be decided upon by referring to the table information such that the heat-generating-body temperature after the increase by the certain amount ΔPout becomes equal to the certain threshold Th1 (or a temperature just smaller than the certain threshold Th1). For example, the flow rate u corresponding to the current heat generation amount, the current liquid temperature, and the certain threshold Th1 (or a temperature just smaller than the certain threshold Th1) may be calculated by referring to the table information and the certain amount ΔPout may be decided upon such that the calculated flow rate u (target flow rate) is realized.

In step 1308, it is determined whether the degree of opening of the valve 19 may be increased. In the case where the degree of opening of the valve 19 may be increased (that is, in the case where the degree of opening of the valve 19 is not the maximum value within the certain range of variation), the processing proceeds to step 1310 and otherwise the processing proceeds to step 1312.

In step 1310, the degree of opening of the valve 19 is increased by a certain degree of opening and the processing returns to step 1300. The certain degree of opening may be any suitable degree of opening and may be varied so as to become larger the larger the absolute value of the difference between the heat-generating-body temperature and the certain threshold Th1 becomes. In addition, the certain degree of opening may be decided upon by referring to the table information such that the heat-generating-body temperature after the increase by the certain degree of opening becomes equal to the certain threshold Th1 (or a temperature just smaller than the certain threshold Th1). For example, the liquid temperature corresponding to the current heat generation amount, current flow rate u, and the certain threshold Th1 (or temperature just smaller than the certain threshold Th1) may be calculated by referring to the table information and the certain degree of opening may be decided upon such that the calculated liquid temperature is realized. In this case, the current flow rate u may be calculated by performing the flow rate calculation processing illustrated in FIG. 9.

In step 1312, an instruction to decrease the heat generation amount is output to the heat-generating body 70 (heat-generating component 34a). The heat-generating body 70 (heat-generating component 34a) may decrease its heat generation amount in response to the instruction. For example, if the heat-generating component 34a is a CPU, it may reduce its frequency, it may reduce its voltage, or power supply thereto may be cut off. In addition, at this time, the service processor 40 may inform a system administrator of an abnormality. In the case where the service processor 40 is able to directly control the heat generation amount of the heat-generating body 70, the service processor 40 may reduce the heat generation amount of the heat-generating body 70 in accordance with the instruction.

In the heat generation amount control illustrated in FIG. 13, the pump 12 and the valve 19 may be controlled so that the heat-generating-body temperature of the heat-generating body 70 becomes equal to or less than the certain threshold Th1. In addition, in the case where the heat-generating-body temperature of the heat-generating body 70 does not become equal to or less than the certain threshold Th1 even when the flow rate and the heat exchange performance are maximized by using the pump 12 and the valve 19, the heat-generating body 70 may be protected by lowering the heat generation amount of the heat-generating body 70.

The processing illustrated in FIG. 13 is executed with a specific one heat-generating body 70 as a target (heat-generating component 34a in this example). However, the processing may be performed with two or more heat-generating bodies 70 (for example, the heat-generating component 34b or heat-generating components on the other boards 32B, 32C and 32D) as targets.

In addition, in the processing illustrated in FIG. 13, the possibility of increasing the output of the pump 12 and the possibility of increasing the degree of opening of the valve 19 are determined so as not to restrict operation of the heat-generating body 70 where possible. However, just one or both of the possibility of increasing the output of the pump 12 and the possibility of increasing the degree of opening of the valve 19 may be determined. For example, in the case of a configuration in which the heat radiation performance of the heat exchanger 16 may not be changed, just the probability of increasing the output of the pump 12 may be determined (the processing in step 1308 and step 1310 in FIG. 13 may be omitted).

Figure 14:
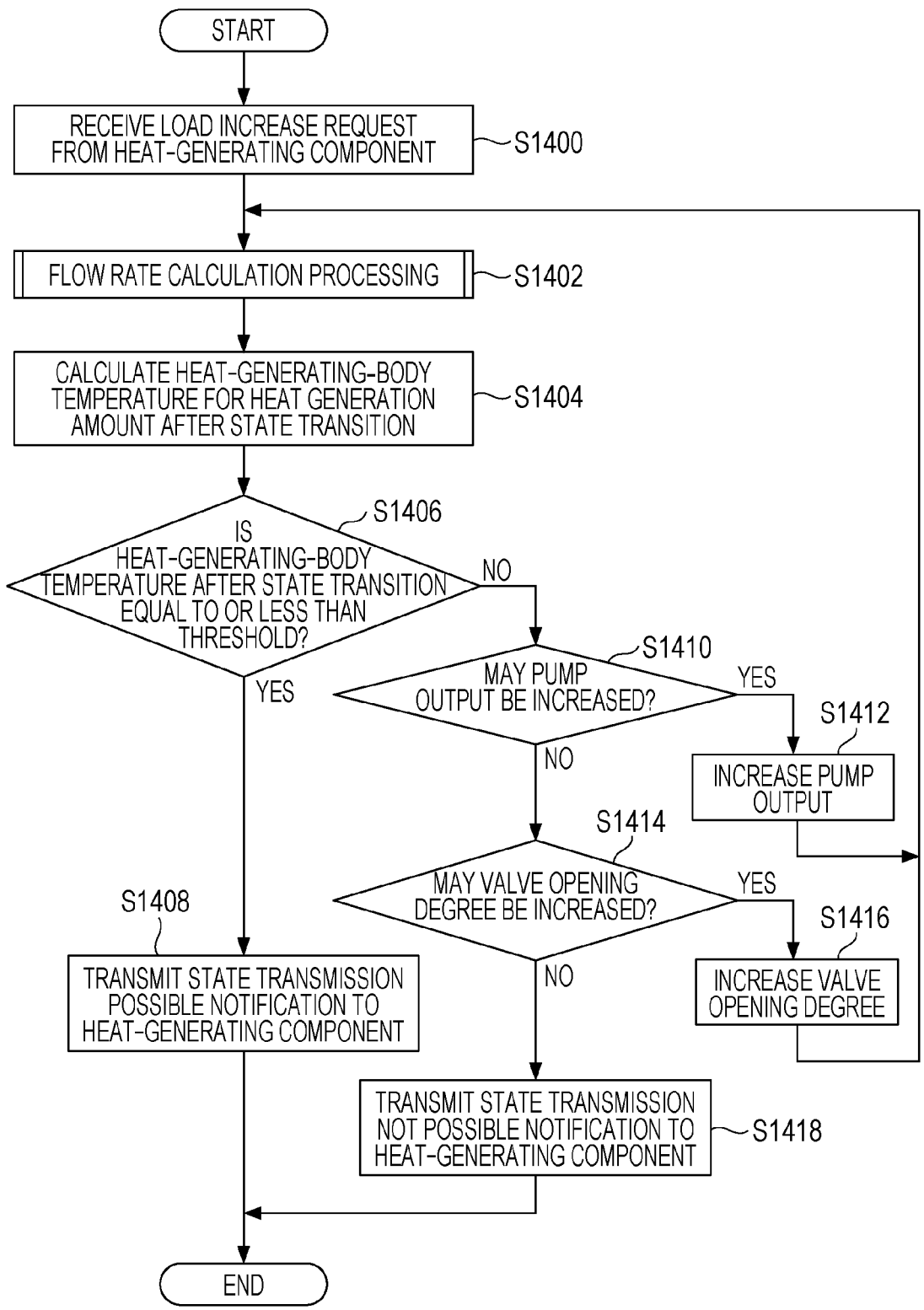
FIG. 14 is a flowchart illustrating an example of processing of determining whether the heat generation amount may be increased that may be performed by the service processor.

FIG. 14 is a flowchart illustrating an example of processing of determining whether the heat generation amount may be increased that may be performed by the service processor 40. Here, as an example, the heat-generating body 70 is assumed to be the heat-generating component 34a (refer to FIG. 2).

In step 1400, a load increase request (load information) is received from the heat-generating body 70. When the heat-generating body 70 will perform processing in which the load (heat generation amount) will be increased from that at the current time, the heat-generating body 70 transmits a load increase request to the service processor 40. After that, upon receiving a state transition possible notification from the service processor 40, the heat-generating body 70 begins the processing in which the load will be increased. The load increase request may include information indicating the heat generation amount after the increase (or the amount of increase).

In step 1402, flow rate calculation processing is performed. The flow rate calculation processing may be as illustrated in FIG. 9.

In step 1404, the heat-generating-body temperature (heat-generating-body temperature after state transition) for the heat generation amount after the state transition is calculated based on the flow rate u calculated in step 1402. That is, the heat-generating-body temperature Ts corresponding to the flow rate u calculated in step 1402, the current liquid temperature (presumed to be maintained after state transition), and the heat generation amount after the state transition is calculated by referring to the table information. For example, in the example illustrated in FIG. 6, in the case where the current heat generation amount is $Q_2$ and a request is made to increase the heat generation amount to $Q_3$, the heat generation amount after the state transition is $Q_3$. At this time, when the flow rate u calculated in step 1402 is for example 0.64 l/min, the heat-generating-body temperature Ts for the heat generation amount $Q_3$ after the state transition is $Ts_2$.

In step 1406, it is determined whether the heat-generating-body temperature after the state transition calculated in step 1404 is equal to or less than a certain threshold Th1. The certain threshold Th1 is a threshold determined from the viewpoint of avoiding breakdown of and occurrence of abnormalities in the heat-generating body 70 as explained in the processing of step 1302 in FIG. 13, and for example may be an upper limit of a temperature range in which breakdown of or abnormalities in the heat-generating body 70 do not occur. In the case where the heat-generating-body temperature after the state transition is equal to or less than the certain threshold Th1, the processing proceeds to step 1408 and otherwise the processing proceeds to step 1410.

In step 1408, a notification stating that the requested state transition is possible (state transition possible notification) is transmitted to the heat-generating body 70 (heat-generating component 34a). In response to this, the heat-generating component 34a begins the processing in which the load will be increased.

In step 1410, it is determined whether the output of the pump 12 may be increased. In the case where the output of the pump 12 may be increased (that is, in the case where the output of the pump 12 is not a maximum value within the certain range of variation), the processing proceeds to step 1412 and otherwise the processing proceeds to step 1414.

In step 1412, the output of the pump 12 is increased by a certain amount ΔPout and the processing returns to step 1402. In this case, in step 1402, the flow rate u after the output of the pump 12 has been increased by the certain amount ΔPout is calculated. The certain amount ΔPout may be any suitable amount and may be varied so as to become larger the larger the absolute value of the difference between the heat-generating-body temperature after the state transition and the certain threshold Th1 becomes. In addition, the certain amount ΔPout may be decided upon by referring to the table information such that the heat-generating-body temperature after the state transition after the increase by the certain amount ΔPout becomes equal to the certain threshold Th1 (or a temperature just smaller than the certain threshold Th1). For example, the flow rate u corresponding to the heat generation amount after the state transition, the current liquid temperature, and the certain threshold Th1 (or temperature just smaller than the certain threshold Th1) may be calculated by referring to the table information and the certain amount ΔPout may be decided upon such that the calculated flow rate u (target flow rate) is realized. At this time, the certain amount ΔPout may be decided upon in accordance with the calculated flow rate u (target flow rate) and the current flow rate u (calculated in step 1402). In addition, the flow rate u may be calculated by referring to the table information and the output of the pump 12 may be controlled via feedback such that the calculated flow rate u becomes the target flow rate.

In step 1414, it is determined whether the degree of opening of the valve 19 may be increased. In the case where the degree of opening of the valve 19 may be increased (that is, in the case where the degree of opening of the valve 19 is not the maximum value within the certain range of variation), the processing proceeds to step 1416 and otherwise the processing proceeds to step 1418.

In step 1416, the degree of opening of the valve 19 is increased by a certain degree of opening and the processing returns to step 1402. In this case, in step 1402, the flow rate u after the degree of opening of the valve 19 has been increased by the certain degree of opening is calculated (however, the flow rate u may be regarding as not having changed and for example liquid temperature information after the change in degree of opening of the valve 19 may be obtained instead). The certain degree of opening may be any suitable degree of opening and may be varied so as to become larger the larger the absolute value of the difference between the heat-generating-body temperature after the state transition and the certain threshold Th1 becomes. In addition, the certain degree of opening may be decided upon by referring to the table information such that the heat-generating-body temperature after the state transition after the increase by the certain degree of opening becomes equal to the certain threshold Th1 (or a temperature just smaller than the certain threshold Th1). For example, the liquid temperature corresponding to the heat generation amount after the state transition, the current flow rate u (calculated in step 1402), and the certain threshold Th1 (or a temperature just smaller than the certain threshold Th1) may be calculated by referring to the table information and the certain degree of opening may be decided upon such that the calculated liquid temperature is realized.

In step 1418, a notification stating that the requested state transition is not possible (state transition not possible notification) is transmitted to the heat-generating body 70 (heat-generating component 34*a*). In response to this, the heat-generating component 34*a* may halt or inhibit processing in which the load would be increased.

With the processing illustrated in FIG. 14, it is possible to calculate the heat-generating-body temperature after the state transition by referring to the table information based on the flow rate u calculated by referring to the table information. Thus, it may be determined whether or not to allow a state transition based on the relationship between the calculated heat-generating-body temperature after the state transition and the certain threshold Th1.

In the processing illustrated in FIG. 14, the possibility of increasing the output of the pump 12 and the possibility of increasing the degree of opening of the valve 19 are determined in order to grant a load increase request from the heat-generating body 70 where possible. However, just one or both of the possibility of increasing the output of the pump 12 and the possibility of increasing the degree of opening of the valve 19 may be determined. For example, in the case of a configuration in which the heat radiation performance of the heat exchanger 16 may not be changed, just the possibility of increasing the output of the pump 12 may be determined (the processing in step 1414 and step 1416 in FIG. 14 may be omitted).

In addition, the processing of determining whether the heat generation amount may be increased illustrated in FIG. 14 (similarly for processing performed when there is a decrease in the heat generation amount illustrated in FIG. 15 described later) is performed with a specific one heat-generating body 70 (heat-generating component 34*a* in this example) as a target. However, the processing may be performed with two or more heat-generating bodies 70 (for example, the heat-generating component 34*b* or heat-generating components on the other boards 32B, 32C and 32D) as targets. However, in that case, table information has to be generated for each heat-generating body 70. In order to generate table information for each heat-generating body 70, liquid temperature meters 14 that measure the liquid temperature for corresponding heat-generating bodies 70 may be provided upstream of the heat-generating bodies 70 in a state in which there is no other heat generating body between the corresponding heat-generating body 70 and the corresponding liquid temperature meter 14. In this case, the number of liquid temperature meters 14 that are used is the same as the number of heat-generating bodies 70 that are targets. Alternatively, the liquid temperature meter 14 may be provided in a state in which there is another heat-generating body between itself and the heat-generating body 70 that is a target. In this case, just one liquid temperature meter 14 is provided. For example, in the case where a specific heat-generating component 34 on the board 32B is made to be a target in addition to the heat-generating component 34*a*, as illustrated in FIG. 1, the heat-generating components 34 on the board 32A exist as other heat-generating objects between the liquid temperature meter 14 and the heat-generating component 34 on the board 32B. In this case, when table information is generated with the heat-generating components 34 on the board 32B being the heat-generating body 70, the heat generation amount of the heat-generating components 34 on the board 32A may be added as a new parameter. That is, the table information represents a relationship between the liquid temperature, the heat generation amount of the heat-generating components 34 on the board 32A, the heat generation amount of the heat-generating body 70 (heat-generating components 34 on board 32B), the temperature of the heat-generating body 70 (heat-generating-body temperature), and the flow rate u. Alternatively, a liquid temperature increase amount corresponding to the heat generation amount of the heat-generating components 34 on the board 32A may be calculated and the calculated liquid temperature increase amount may be used by being added to the measurement value of the liquid temperature meter 14.

Figure 15:
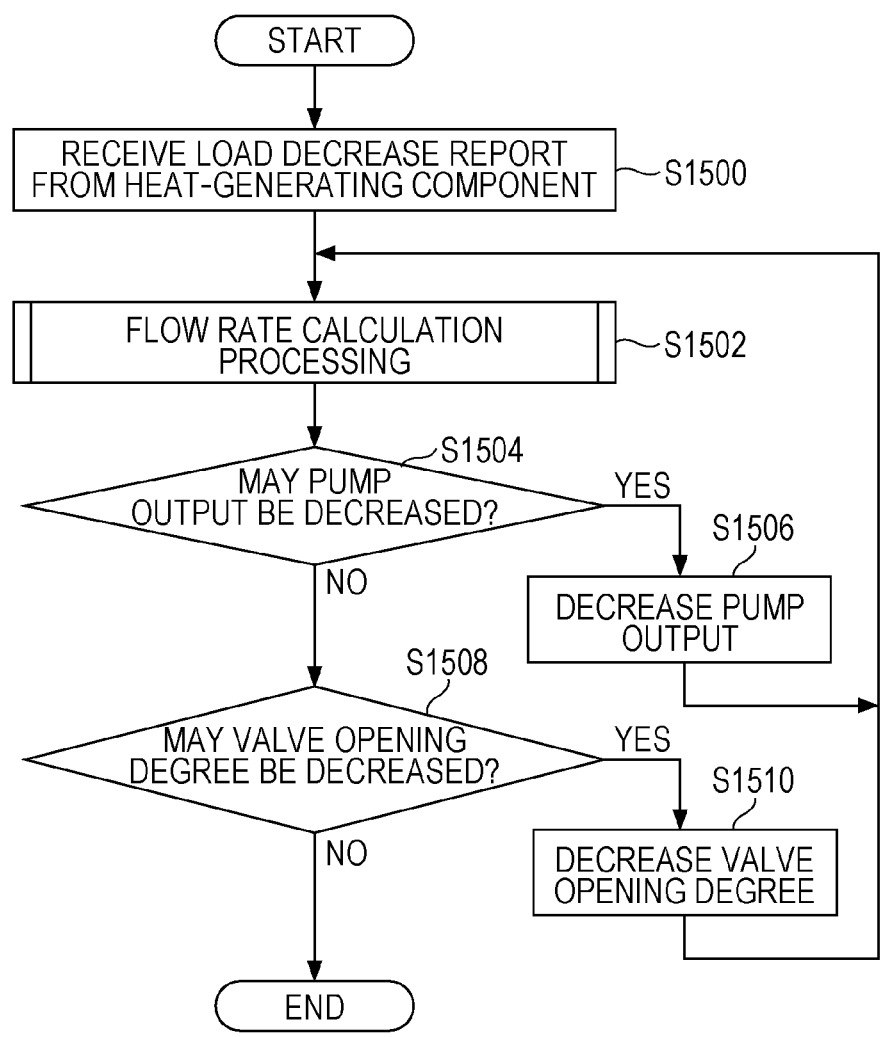
FIG. 15 is a flowchart illustrating an example of processing performed when the heat generation amount falls that may be performed by the service processor.

FIG. 15 is a flowchart illustrating an example of processing performed when the heat generation amount falls that may be performed by the service processor 40. Here, as an example, the heat-generating body 70 is assumed to be the heat-generating component 34a (refer to FIG. 2).

In step 1500, a load decrease report (load information) is received from the heat-generating body 70. In the case where the load (heat generation amount) has decreased from that at the current time, the heat-generating body 70 transmits a load decrease report to the service processor 40. The load decrease report is an ex-post facto report that informs the service processor 40 of the fact that the load (heat generation amount) has decreased. The load decrease report may include information indicating the heat generation amount after the decrease (or decrease amount).

In step 1502, flow rate calculation processing is performed. The flow rate calculation processing may be as illustrated in FIG. 9. In the flow rate calculation processing, as described above, the liquid temperature information, the heat generation amount information, and the heat-generating-body temperature information are obtained and therefore information on the heat generation amount after the load decrease is also obtained.

In step 1504, it is determined whether the output of the pump 12 may be decreased. In the case where the output of the pump 12 may be decreased (that is, in the case where the output of the pump 12 is not a minimum value in the certain range of variation), the processing proceeds to step 1506, and otherwise the processing proceeds to step 1508.

In step 1506, the output of the pump 12 is decreased by a certain amount ΔPout and the processing returns to step 1502. In this case, in step 1502, the flow rate u after the output of the pump 12 has been decreased by the certain amount ΔPout is calculated. The certain amount ΔPout may be any suitable amount and similarly to as in step 1306 may be varied so as to become larger the larger the absolute value of the difference between the heat-generating-body temperature and the certain threshold Th1 becomes. In this case, in step 1502, the flow rate calculation is not performed and just the liquid temperature information, the heat generation amount information, and the heat-generating-body temperature information may be obtained. In addition, the certain amount ΔPout may be decided upon by referring to the table information such that the heat-generating-body temperature after the decrease by the certain amount ΔPout becomes equal to the certain threshold Th1 (or a temperature just smaller than the certain threshold Th1). For example, the flow rate u corresponding to the heat generation amount after the load decrease, the liquid temperature (current liquid temperature), and the certain threshold Th1 (or temperature just smaller than the certain threshold Th1) may be calculated by referring to the table information and the certain amount ΔPout may be decided upon such that the calculated flow rate u (target flow rate) is realized. At this time, the certain amount ΔPout may be decided upon in accordance with the calculated flow rate u (target flow rate) and the current flow rate u (calculated in step 1402).

In step 1508, it is determined whether the degree of opening of the valve 19 may be decreased. In the case where the degree of opening of the valve 19 may be decreased (that is, in the case where the degree of opening of the valve 19 is not the minimum value within the certain range of variation), the processing proceeds to step 1510, and otherwise the processing is terminated.

In step 1510, the degree of opening of the valve 19 is decreased by a certain degree of opening and the processing returns to step 1502. In this case, in step 1502, the flow rate u after the degree of opening of the valve 19 has been decreased by the certain degree of opening is calculated (however, the flow rate u may be regarded as not having changed, and the liquid temperature information and so forth after the change in the degree of opening of the valve 19 may just be obtained). The certain degree of opening may be any suitable degree of opening and may be varied so as to become larger the larger the absolute value of the difference between the heat-generating-body temperature and the certain threshold Th1 becomes. In addition, the certain degree of opening may be decided upon by referring to the table information such that the heat-generating-body temperature after the decrease by the certain degree of opening becomes equal to the certain threshold Th1 (or a temperature just smaller than the certain threshold Th1). For example, the liquid temperature corresponding to the heat generation amount after the decrease, the current flow rate u (calculated in step 1402), and the certain threshold Th1 (or a temperature just smaller than the certain threshold Th1) is calculated by referring to the table information and the certain degree of opening may be decided upon such that the calculated liquid temperature is realized.

With the processing described in FIG. 15, in the case where the heat generation amount of the heat-generating component 34 is reduced, it is possible to increase energy efficiency by decreasing the output of the pump 12 and so forth in accordance with this reduction. In addition, the output of the pump 12 may be speedily changed to an appropriate output (point at which there is good thermal efficiency) by calculating an amount of decrease (certain amount ΔPout) for the output of the pump 12 by referring to the table information. In addition, the heat radiating performance of the heat exchanger 16 may be speedily changed to an appropriate value by calculating an amount of decrease for the degree of opening of the valve 19 by referring to the table information.

In the processing illustrated in FIG. 15, the possibility of decreasing the output of the pump 12 and the possibility of decreasing the degree of opening of the valve 19 are determined from the viewpoint of energy efficiency. However, just one or both of the possibility of decreasing the output of the pump 12 and the possibility of decreasing the degree of opening of the valve 19 may be determined. For example, in the case of a configuration in which the heat radiating performance of the heat exchanger 16 may not be changed, only the possibility of decreasing the output of the pump 12 may be determined (the processing in step 1508 and step 1510 in FIG. 15 may be omitted).

Figure 16:
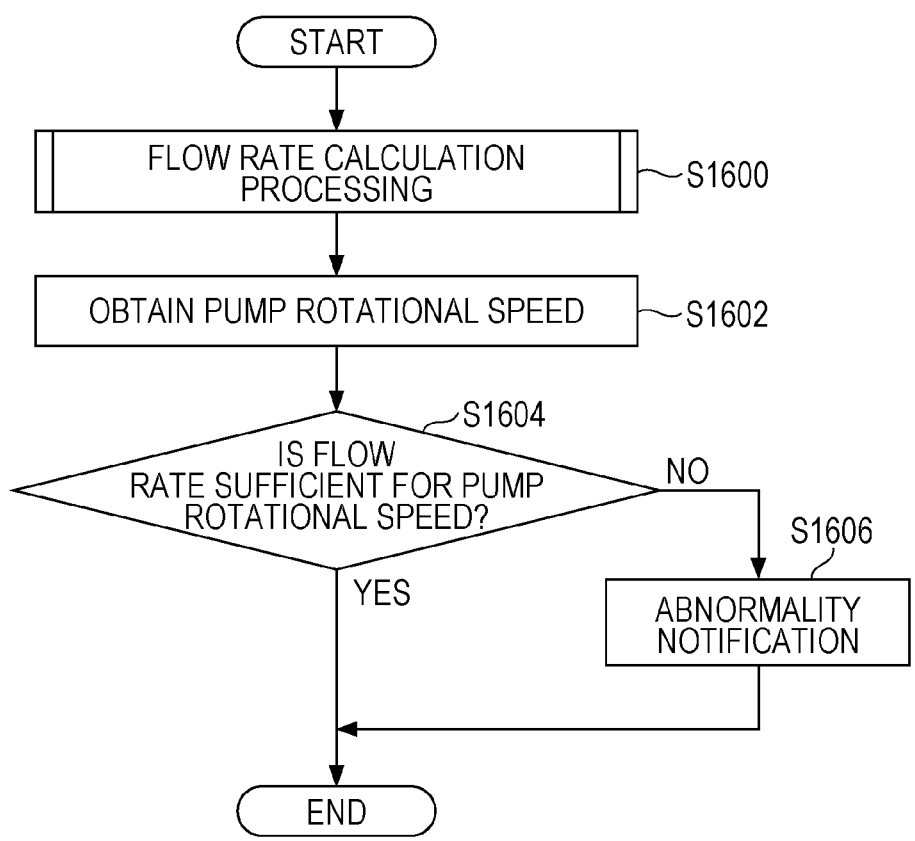
FIG. 16 is a flowchart illustrating an example of abnormality determination processing that may be performed by the service processor.

FIG. 16 is a flowchart illustrating an example of abnormality determination processing that may be performed by the service processor 40. In the example illustrated in FIG. 16, it is assumed that information indicating a relationship between the flow rate u inside the cooling flowpath 22 and the output (rotational speed) of the pump 12 at a normal time (hereafter, referred to as pump output design information) is obtained in advance through tests and so forth and stored in the non-volatile memory 42. The pump output design information may be obtained (generated) at the same time as the above-described table information is obtained.

In step 1600, flow rate calculation processing is performed. The flow rate calculation processing may be as illustrated in FIG. 9.

In step 1602, information indicating the current rotational speed of the pump 12 is obtained. This information may be based on measurement results of a sensor (not illustrated) that generates an electrical signal in accordance with the rotational speed of the pump 12. Alternatively, information representing the rotational speed of the pump 12 may be generated based on for example the current supplied to the pump 12.

In step 1604, it is determined whether the flow rate u calculated in step 1600 is sufficient for the current rotational speed of the pump 12 based on the pump output design information. For example, a flow rate corresponding to the current rotational speed of the pump 12 (flow rate at normal time) is calculated based on the pump output design information and it may be determined whether the difference (divergence) between the calculated normal-time flow rate and the flow rate u calculated in step 1600 is equal to or higher than a certain threshold. The certain threshold may correspond to a lower limit of a range in which a reduction in the flow rate may occur at an abnormal time to be detected and may be adjusted through tests and so forth. Abnormalities to be detected may be abnormalities such as clogging. In the case where the current flow rate u is sufficient for the current rotational speed of the pump 12, the processing is terminated and otherwise the processing proceeds to step 1606.

In step 1606, information indicating an abnormality is output (notified) to the outside. That is, the service processor 40 may notify a system administrator of the abnormality (flow rate decrease). This notification may be realized using any suitable method. For example, the notification may be realized using sound or images.

With the processing illustrated in FIG. 16, it is possible to detect an abnormality without using a flowmeter in a case where the flow rate has decreased due to an abnormality such as clogging.

Embodiments have been described in detail above, but the current disclosure is not limited to these specific embodiments and various modifications and changes are possible within the scope of the appended claims. In addition, all of or a plurality of the constituent elements of the above-described embodiments may be combined with each other.

For example, in the above-described embodiments, the liquid temperature meter 14 is provided inside the coolant circulation device 10, but may instead be provided inside the computer 30. In addition, in the above-described embodiments, the heat-generating body 70, which is a heat-generating body other than the heat-generating components 34 inside the computer 30, is provided inside the computer 30, but may instead be provided inside the coolant circulation device 10 or in another place (place thermally connected to the cooling flowpath 22).

In addition, in the above-described embodiments, the configuration of the heat exchanger 16 may be any suitable configuration such as a spiral type or plate type configuration for example. In addition, the heat exchanger 16 is not limited to being a type of heat exchanger that performs heat exchange between a liquid and a liquid (liquid-liquid heat exchanger system) and may instead be a type of heat exchanger that performs heat exchange between a liquid and a gas for example. For example, the heat exchanger 16 may be an air-cooling type or a finned tube type of heat exchanger. Similarly in this case, the liquid inside the cooling flowpath 22 is cooled by the heat exchanger 16.

In addition, in the above-described embodiments, the liquid temperature meter 14 is provided in a state such that there is no other heat-generating object between itself and the heat-generating body 70, but the liquid temperature meter 14 may be instead provided in a state in which there is another heat-generating object between itself and the heat-generating body 70. For example, in the example illustrated in FIG. 1, when the heat-generating body 70 is the heat-generating component 34a, the liquid temperature meter 14 may be provided between the board 32A and the board 32B in the cooling flowpath 22 or may be provided downstream of the board 32D, and the installation position thereof may be any suitable position. In this case, table information may be generated taking a heat generation amount of the other heat-generating object that exists between the heat-generating body 70 and the liquid temperature meter 14 in the direction of flow of the liquid as a new parameter. That is, the table information represents the relationship between the liquid temperature, the heat generation amount of the other heat-generating object (other heat-generating object that exists between the heat-generating body 70 and the liquid temperature meter 14 in the direction of flow of the liquid), the heat generation amount of the heat-generating body 70, the temperature of the heat-generating body 70 (heat-generating-body temperature), and the flow rate u. Alternatively, a liquid temperature increase according to the heat generation amount of the other heat-generating object may be calculated and the calculated liquid temperature increase may be used by being added to a measurement value of the liquid temperature meter 14.

In addition, as described above, in addition to the flow rate calculation processing illustrated in FIG. 9 and so forth, the service processor 40 performs the processing illustrated in FIG. 13, FIG. 14, FIG. 15, and FIG. 16, but the processing illustrated in FIG. 13, FIG. 14, FIG. 15, and FIG. 16 may be performed however is appropriate. For example, the service processor 40 may perform the flow rate calculation processing and not perform the processing illustrated in FIG. 13, FIG. 14, FIG. 15, and FIG. 16. Moreover, in addition to the flow rate calculation processing illustrated in FIG. 9 and so forth, the service processor 40 may perform a combination of any one or two, or three of the four processing operations illustrated in FIG. 13, FIG. 14, FIG. 15, and FIG. 16.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An electronic apparatus comprising:
a flowpath through which a liquid flows;
a heat-generating body that is cooled by the liquid;
a first temperature detector that measures a temperature of the liquid;
a second temperature detector that measures a temperature of the heat-generating body;
a power meter that measures a heat generation amount of the heat-generating body;
a storage that stores relationship information representing a relationship between a temperature of the liquid, a temperature of the heat-generating body, a heat generation amount of the heat-generating body, and a flow rate of the liquid; and a processor configured to:
calculate the flow rate of the liquid according to the temperature of the liquid, the temperature of the heat-generating body, and the heat generation amount of the heat-generating body based on the relationship information stored in the storage, and
control the electronic apparatus based on the calculated flow rate of the liquid.

2. The electronic apparatus according to claim 1, wherein the heat-generating body is an electronic component whose heat generation amount changes during operation thereof.

3. The electronic apparatus according to claim 2,
wherein the heat-generating body transmits a heat generation amount increase request to the processor when the heat generation amount will increase from a current state, and
the processor, upon receiving the heat generation amount increase request from the heat-generating body, calculates a temperature of the heat-generating body after the heat generation amount increase based on the calculated flow rate of the liquid and the relationship information in the storage and determines whether to allow the heat generation amount increase based on a relationship between the calculated temperature of the heat-generating body after the heat generation amount increase and a certain threshold.

4. The electronic apparatus according to claim 3, further comprising
a pump that is provided in the flowpath and whose output may be changed,
wherein the processor, upon receiving the heat generation amount increase request from the heat-generating body, increases the output of the pump and calculates the flow rate of the liquid after the increase in the output of the pump.

5. The electronic apparatus according to claim 3, further comprising
a heat exchanger that is provided in the flowpath and whose heat exchange performance may be changed,
wherein the processor, upon receiving the heat generation amount increase request from the heat-generating body increases the heat exchange performance of the heat exchanger and calculates the temperature of the heat-generating body after the heat generation amount increase after the increase in the heat exchange performance of the heat exchanger.

6. The electronic apparatus according to claim 2, further comprising
a pump that is provided in the flowpath and whose output may be changed,
wherein, when the heat generation amount has decreased from a current state, the heat-generating body transmits a report stating that the heat generation amount has decreased to the processor, and
the processor, upon receiving the report from the heat-generating body, decides upon a decrease amount for the output of the pump based on the calculated flow rate of the liquid and the relationship information inside the storage.

7. The electronic apparatus according to claim 2, further comprising
a heat exchanger that is provided in the flowpath and whose heat exchange performance may be changed,
wherein, when the heat generation amount has decreased from a current state, the heat-generating body transmits a report stating that the heat generation amount has decreased to the processor, and
the processor, upon receiving the report from the heat-generating body, decides upon a decrease amount for the heat exchange performance of the heat exchanger based on the calculated flow rate of the liquid and the relationship information inside the storage.

8. The electronic apparatus according to claim 2, wherein the relationship includes a relationship in which the heat generation amount of the heat-generating body is a first heat generation amount and a relationship in which the heat generation amount of the heat-generating body is a second heat generation amount that is different from the first heat generation amount.

9. The electronic apparatus according to claim 1, further comprising
a pump that is provided in the flowpath and whose output may be changed,
wherein the processor changes the output of the pump based on the calculated flow rate of the liquid.

10. The electronic apparatus according to claim 1, further comprising
a heat exchanger that is provided in the flowpath and whose heat exchange performance may be changed,
wherein the processor changes the heat exchange performance of the heat exchanger based on the calculated flow rate of the liquid.

11. The electronic apparatus according to claim 1, further comprising
a heat exchanger provided in the flowpath,
wherein the first temperature detector measures the temperature of the liquid downstream of the heat exchanger and upstream of the heat-generating body.

12. The electronic apparatus according to claim 1, further comprising
a pump that is provided in the flowpath and whose output may be changed,
wherein the storage stores second relationship information indicating a relationship between the output of the pump and the flow rate of the liquid, and
the processor determines a presence of a flow rate decrease due to an abnormality from a relationship between a calculated flow rate of the liquid and a measured value representing an output of the pump based on the second relationship information.

13. The electronic apparatus according to claim 1, wherein the relationship information indicating the relationship is table information.

14. The electronic apparatus according to claim 1, wherein the relationship includes a relationship in which the flow rate of the liquid is a first flow rate and a relationship in which the flow rate of the liquid is a second flow rate different from the first flow rate.

15. The electronic apparatus according to claim 1, wherein the relationship includes a relationship in which the temperature of the liquid is a first temperature and a relationship in which the temperature of the liquid is a second temperature that is different from the first temperature.

16. The electronic apparatus according to claim 1, wherein the relationship includes a relationship in which the temperature of the heat-generating body is a first temperature and a relationship in which the temperature of the heat-generating body is a second temperature that is different from the first temperature.

17. A method of controlling an electronic apparatus, comprising:
- measuring a temperature of a liquid flowing inside a flowpath that passes through the electronic apparatus using a first temperature detector;
- measuring a temperature of a heat-generating body that is cooled by the liquid using a second temperature detector;
- measuring a heat generation amount of the heat-generating body using a power meter;
- calculating, by a processor, a flow rate of the liquid according to the measured temperature of the liquid, the measured temperature of the heat-generating body, and the heat generation amount of the heat-generating body based on information stored in a storage that stores the relationship information representing a relationship between a temperature of the liquid, a temperature of the heat-generating body, a heat generation amount of the heat-generating body, and a flow rate of the liquid, and
- controlling the electronic apparatus based on the calculated flow rate of the liquid.

18. A control device comprising:
circuitry configured to:
- acquire a temperature of a liquid flowing inside a flowpath that passes through an electronic apparatus from a first temperature detector,
- acquire a temperature of a heat-generating body that is cooled by the liquid from a second temperature detector,
- acquire a heat generation amount of the heat-generating body from a power meter,
- calculate a flow rate of the liquid according to the temperature of the liquid, the temperature of the heat-generating body, and the heat generation amount of the heat-generating body based on information stored in a storage that stores relationship information representing a relationship between a temperature of the liquid, a temperature of the heat-generating body, a heat generation amount of the heat-generating body, and a flow rate of the liquid, and
- control the electronic apparatus based on the calculated flow rate of the liquid.

* * * * *